(12) United States Patent
Aono et al.

(10) Patent No.: US 9,385,257 B2
(45) Date of Patent: Jul. 5, 2016

(54) SOLUTION SEARCHING SYSTEM BY QUANTUM DOTS

(71) Applicant: RIKEN, Wako, Saitama (JP)

(72) Inventors: Masashi Aono, Saitama (JP); Song-Ju Kim, Saitama (JP); Masahiko Hara, Saitama (JP); Makoto Naruse, Tokyo (JP); Tadashi Kawazoe, Tokyo (JP); Motoichi Ohtsu, Tokyo (JP)

(73) Assignee: RIKEN, Saitama (JP)

( * ) Notice: Subject to any disclaimer, the term of this patent is extended or adjusted under 35 U.S.C. 154(b) by 258 days.

(21) Appl. No.: 13/898,335

(22) Filed: May 20, 2013

(65) Prior Publication Data

US 2013/0313406 A1    Nov. 28, 2013

(30) Foreign Application Priority Data

May 22, 2012  (JP) ................................ 2012-116725

(51) Int. Cl.
| | |
|---|---|
| *G01J 1/32* | (2006.01) |
| *H01L 31/147* | (2006.01) |
| *G02F 3/00* | (2006.01) |
| *H01L 31/14* | (2006.01) |

(52) U.S. Cl.
CPC ............... *H01L 31/147* (2013.01); *G02F 3/00* (2013.01); *H01L 31/14* (2013.01); *G02F 2202/108* (2013.01)

(58) Field of Classification Search
CPC .................. H01L 31/147; H01L 13/14; H01L 2924/0002; G02F 2202/108; G02F 1/017; G02F 1/01716; G02F 1/01725; G02F 2001/0175; G02F 2001/01758; G02F 2001/01791; G01J 1/04; B82Y 10/00; B82Y 15/00; B82Y 20/00; H01S 5/0683; G06N 99/002
USPC ............................................. 250/205; 385/14
See application file for complete search history.

(56) References Cited

U.S. PATENT DOCUMENTS

| | | | |
|---|---|---|---|
| 2004/0130956 A1* | 7/2004 | Porto et al. ..................... | 365/200 |
| 2010/0119193 A1* | 5/2010 | Englund et al. ................. | 385/16 |
| 2011/0060710 A1* | 3/2011 | Amin .............................. | 706/13 |

FOREIGN PATENT DOCUMENTS

| | | |
|---|---|---|
| JP | 2006-023505 A | 1/2006 |
| JP | 2006-237515 A | 9/2006 |

OTHER PUBLICATIONS

English translation of JP 2006-237515.*
Perkowski, Marek, and Alan Mishchenko, "Logic Synthesis for Regular Fabric realized in Quantum Dot Cellular Automata," 2004.*
Aono, et al., Japan Society for the Promotion of Science; Optoelectronics Committee No. 130, 2012.

(Continued)

*Primary Examiner* — Thanh Luu
(74) *Attorney, Agent, or Firm* — Holtz, Holtz & Volek PC

(57) ABSTRACT

There are provided a quantum dot, a plurality of quantum dots having a larger volume than the quantum dot, a light detection unit for detecting a light emission state of an output light from the plurality of quantum dots, and a light supply unit capable of supplying a control light to the plurality of quantum dots thereby to excite other exciters to a lower level, and controlling energy discharging of the exciters transiting to the lower level, wherein the control light to be supplied by the light supply unit is controlled per quantum dot based on the light emission state of the output light per quantum dot and previously-input search problem information.

18 Claims, 14 Drawing Sheets

(56) References Cited

OTHER PUBLICATIONS

Aono, et al., "Amoeba-Inspired Nanoarchitectonic Computing: Solving Intractable Computational Problems Using Nanoscale Photoexcitation Transfer Dynamics", American Chemical Society Publications; Langmuir, pp. A-H, 2013.

Isoshima, et al., "Natural Computing and Its Implementation with Optical Systems", pp. 1-6, 2015.

Naruse, et al., "Information physics fundamentals of nanophotonics", Reports on Progress in Physics, 76 (2013) 056401, pp. 1-50.

Naruse, et al., "Nanoscale Photonic Network for Solution Searching and Decision Making Problems", The Institute of Electronics, Information and Communication Engineers, vol. E96-B, Nov. 2013, pp. 2724-2732.

Naruse, et al., "Network of Energy Transfer on the Nanoscale and its Application to Solving Constraint Satisfaction Problems", 2012 International Symposium on Nonlinear Theory and its Applications, NOLTA2012, Oct. 22-26, 2012, pp. 578-581.

Naruse, et al., "Spatiotemporal dynamics in optical energy transfer on the nanoscale and its application to constraint satisfaction problems", Physical Review B 86, 125407-1-125407-10 (2012), American Physical Society.

Nomura, et al., "Demonstration of Controlling the Spatiotemporal Dynamics of Optical Near-Field Excitation Transfer in Y-Junction Structure Consisting of Randomly Distributed Quantum Dots", Hindawi Publishing Corporation, Advances in Optical Technologies vol. 2014, Article ID 569684, 8 pages, http://dx.doi.org/10.1155/2014/569684.

* cited by examiner

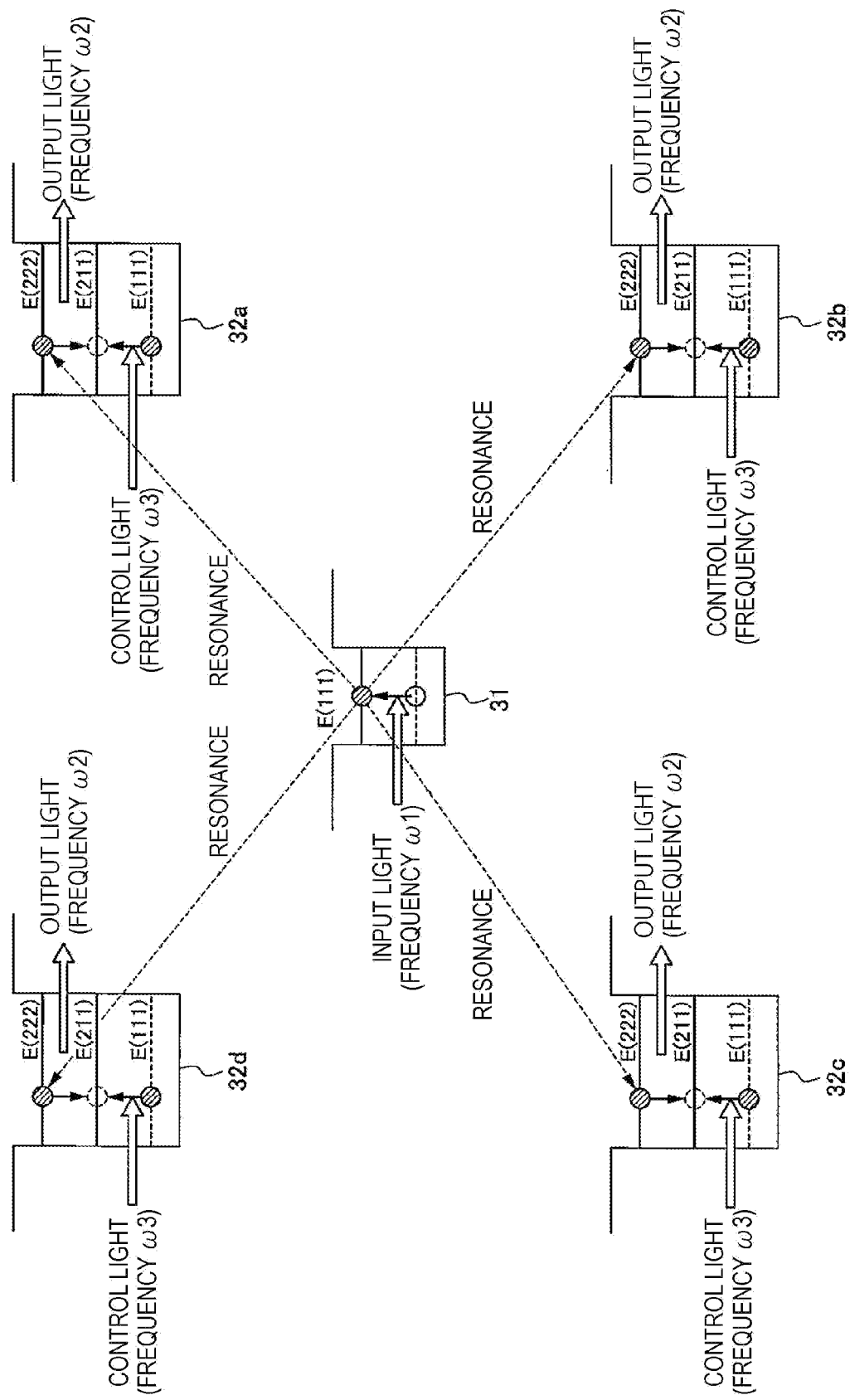

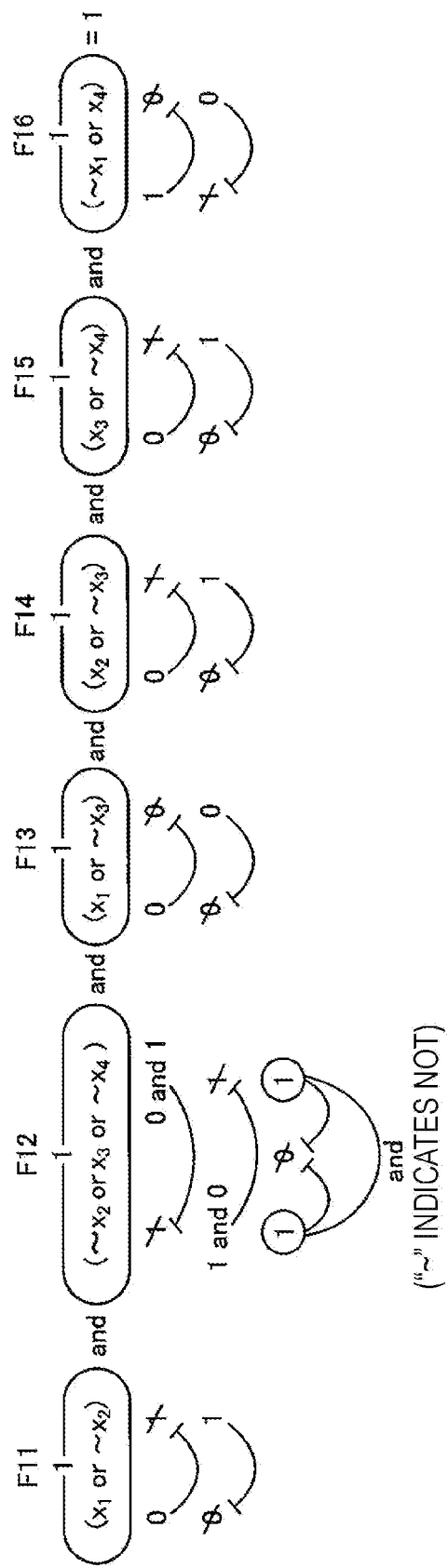

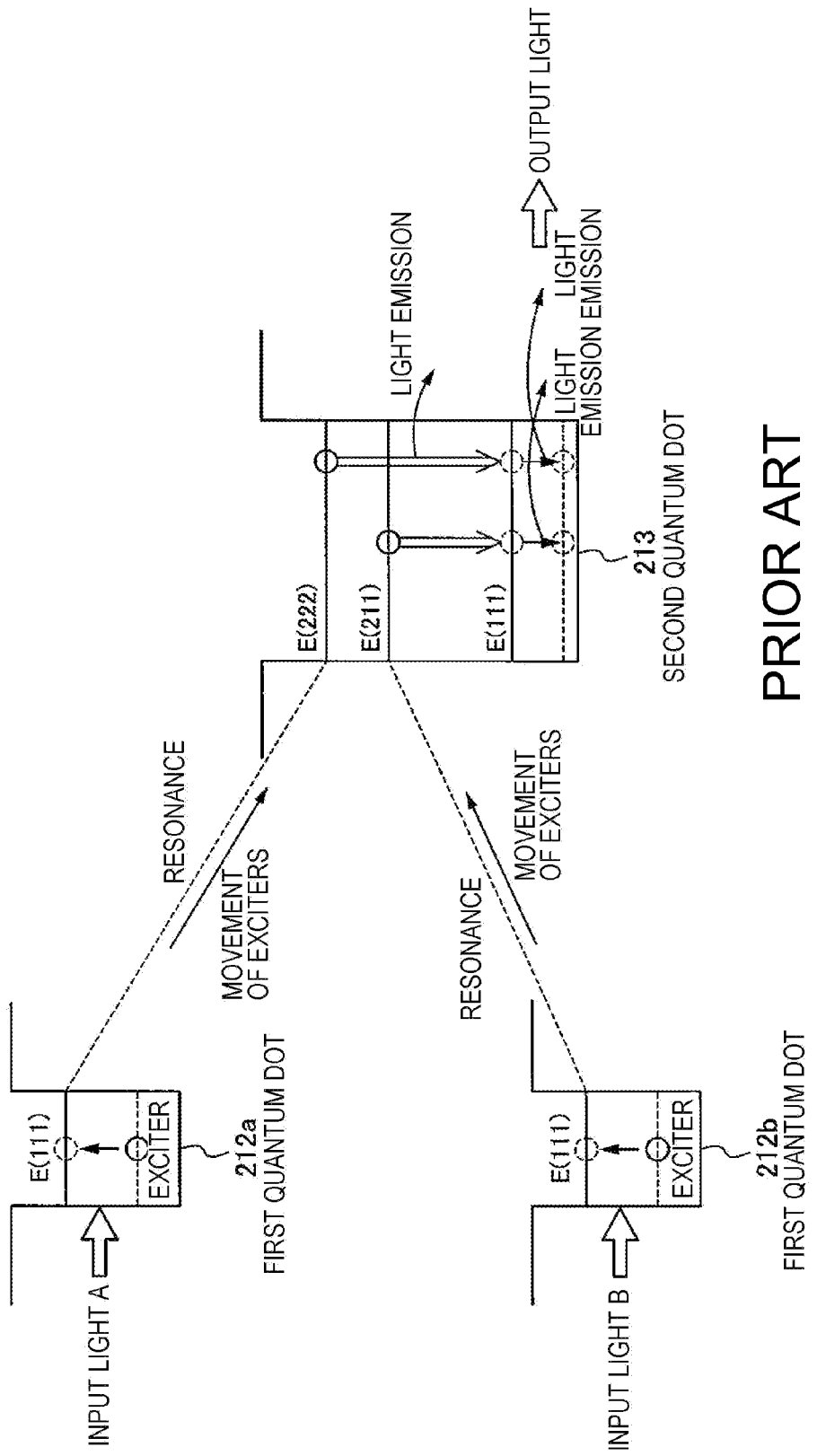

PRIOR ART

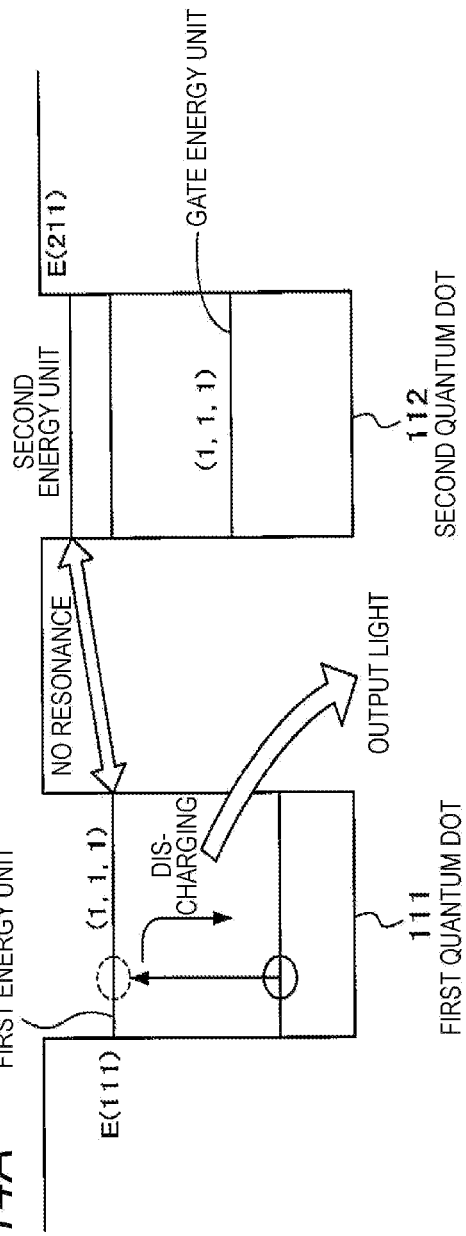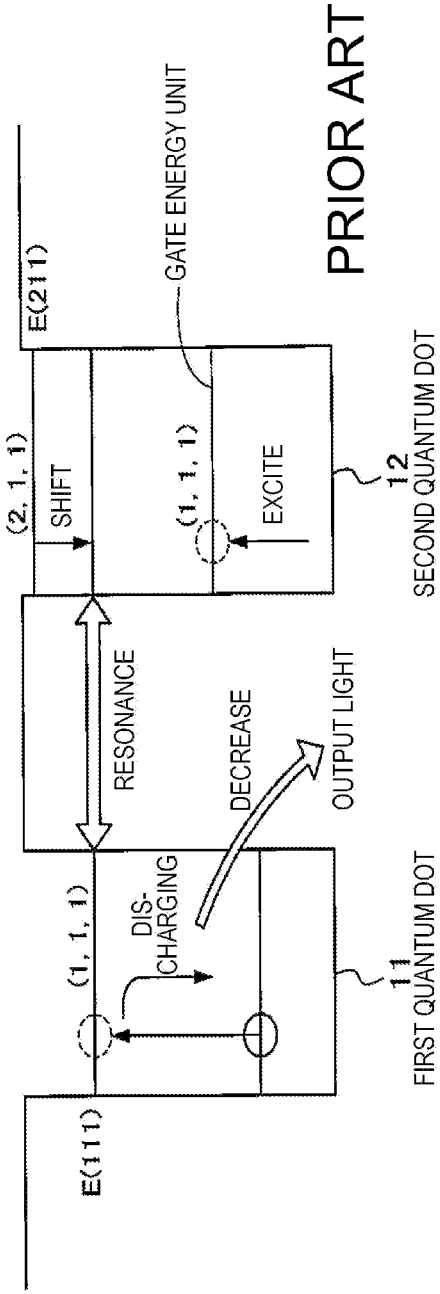

SOLUTION SEARCHING SYSTEM BY QUANTUM DOTS

BACKGROUND

1. Technical Field

The present invention relates to a solution searching system by quantum dots for searching a solution of an optimum solution search problem by use of a nanoscale circuit made of quantum dots.

2. Related Art

In recent years, a nanoscale arithmetic circuit capable of performing logical operation processing without a dominant diffraction limit of light is desired in order to meet requests for future large-capacity information processing. However, there is a problem that a quantum fluctuation occurs when the nanoscale circuit is to be realized in an electronic device, and there is a problem that minimization is restricted due to the diffraction limit of light when the nanoscale circuit is to be realized in an optical device.

There is therefore proposed an arithmetic circuit using nanoscale quantum dots making maximum use of the granularity of electrons by controlling single electrons. The quantum dot is a box which is formed to have a potential sufficient to give 3D quantum confinement to exciters by use of a semiconductor microfabrication technique. By use of the exciter confinement system, an energy level of a carrier in a quantum dot is discrete and a state density is sharpened in a delta function manner. A single-electron memory using light absorption in a sharpened state of the quantum dot or a single-electron transistor for powering ON/OFF single electrons for entrance/exit of quantum dots has been already studied, and a single-electron nanoscale operation is to be realized.

There is proposed an arithmetic circuit using quantum dots particularly in recent years (see JP 2006-023505 A, for example). For example, as illustrated in FIG. 12, an arithmetic circuit made of quantum dots is formed of a second quantum dot 213 at one output side formed on the surface of a substrate, and a plurality of first quantum dots 212 discretely formed around the second quantum dot 213. A light intensity of an output light from the second quantum dot 213 is changed depending on input lights supplied to the first quantum dots 212. The light intensity of the output light from the second quantum dot 213 is controlled by the amount of discharged exciters to a lower level in the second quantum dot 213, and the amount of discharged exciters depends on the amount of exciters transmitted via resonant levels from the quantum dots 212a and 212b. That is, when signal lights A and B are supplied to all the first quantum dots 212a and 212b, respectively, the amount of exciters to be excited accordingly increases and the amount of exciters to be transmitted to the second quantum dot 213 also increases so that the light intensity of the output light based on the discharging increases. To the contrary, when the signal lights A and B are not supplied to all the first quantum dots 212a and 212b, respectively, the amount of exciters to be excited accordingly decreases and the amount of exciters to be transmitted to the second quantum dot 213 also decreases so that the light intensity of the output light based on the discharging lowers. This indicates that the signal lights A and B to be supplied to the respective quantum dots 212a and 212b are controlled thereby to change the light intensity of the output light. That is, the light intensity of the output light assumes to be expressed as a sum of signal lights to be supplied, and if the signal lights can be extracted as output signals, an arithmetic circuit 21 can be operated as a so-called adder circuit for adding the signal lights. Further the arithmetic circuit can be applied for finding so-called OR, in which an output light is emitted if at least one of the signal lights A and B is input in the adder circuit. In this case, a threshold is set to be less than a light emission intensity based on at least one supplied signal light, and when an actual light emission intensity exceeds the threshold, the decision is "true", and when the actual light emission intensity is less than the threshold, the decision is "false." Thereby, as illustrated in FIG. 13A, there can be configured an arithmetic circuit for outputting so-called OR Y of the signal intensities for the inputs A and B.

There is proposed, as an arithmetic circuit using quantum dots, a circuit for NOT operation as described in JP 2006-237515 A, for example. As illustrated in FIG. 13B, the NOT operation circuit by quantum dots functions as an inverter for returning an inverse value to the input A.

Typically, the energy levels between a first quantum dot 111 and a second quantum dot 112 are different as illustrated in FIG. 14A, and thus a resonance will not occur. To the contrary, when a signal light corresponding to a gate signal is supplied to the second quantum dot 112, exciters are correspondingly excited to a gate energy level (1, 1, 1) in the second quantum dot 112. When, exciters are excited to a second energy level (1, 1, 1), a second energy level (2, 1, 1) correspondingly shifts to be lower as illustrated in FIG. 14B. Consequently, the first energy level in the first quantum dot 111 and the second energy level in the second quantum dot 112 are configured at substantially the same level. Thus, a resonance occurs between the first energy level (1, 1, 1) and the second energy level (2, 1, 1), and exciters are injected from the first quantum dot 111 having a small volume into the second quantum dot 112 having a large volume. Additionally, the exciters injected into the second quantum dot 112 transit to the energy level (1, 1, 1) in the second quantum dot 112, and are alleviated.

In this state, when an input light is supplied to the first quantum dot 111, most of the exciters excited at the first energy level (1, 1, 1) move to the second quantum dot 112 along with a movement of the resonant energy, and energy to be discharged to the lower level decreases. Consequently, a light emission intensity based on the energy discharging lowers. The light emission intensity is an output in the arithmetic circuit.

Therefore, the amount of resonant energy movement is changed to the second quantum dot 112 along with ON/OFF of a gate signal to be supplied to the second quantum dot 112, so that the state of the exciters excited at the first energy level in the first quantum dot 111 can be changed. Consequently, the amount of discharged energy to the lower level in the first quantum dot 111 can be controlled, thereby changing the light intensity of the output light. The gate signal is turned on so that the above resonant energy moves and thus the light intensity of the output light lowers, and the gate signal is turned off so that the light intensity of the output light increases. Thus, the light intensity of the output light indicates a reverse trend when the gate signal is turned on or off, and thus the arithmetic circuit can be applied as a so-called NOT operation circuit.

SUMMARY

Arithmetic circuits by quantum dots including the techniques disclosed in JP 2006-023505 A and JP 2006-237515 A enable arithmetic processing without a dominant diffraction limit of light, and enable requests for future large-capacity information processing to be met.

With any of the arithmetic processing by quantum dots, one result is output to one or a plurality of inputs. To the contrary, there has not been proposed an arithmetic circuit by quantum dots capable of reversely searching a plurality of inputs A and B which can meet one output Y when the output Y is determined in FIG. 13A.

Particularly, as a technique for searching an input meeting a previously-given solution, there is a so-called satisfiability problem (SAT) for searching the values of variables contained in a propositional logical formula in order to make the entire given propositional logical formula "true". The satisfiability problem is used in many applications including software and hardware verifications as well as computer support design. Particularly, the satisfiability problem is directed for searching a solution of a representative combination optimization problem having calculation complexity belonging to the same class as the travelling salesman problem (TSP), and is more important in the future information society. There is conventionally known a brute-force method or the like for solving the satisfiability problem. However, there has not particularly been proposed a technique for solving the satisfiability problem in a nanoscale device so fast at low energy consumption without a dominant diffraction limit of light.

The present invention has therefore been made in terms of the above problems, and an object thereof is to provide a solution searching system by quantum dots capable of searching and finding a variable contained in a propositional logical formula by use of quantum dots when the propositional logical formula is given as previously-input search problem information.

In order to solve the above problems, a solution searching system by quantum dots according to the present invention includes an energy supply quantum dot having an energy level where exciters are excited in response to a supplied input light, a plurality of output display quantum dots provided around the energy supply quantum dot, each of which is formed in a larger volume than the energy supply quantum dot, has a resonant level where exciters are injected from the energy level in the input quantum dot, and can emit an output light based on energy discharging of the exciters transiting from the resonant level to a lower level, a light detection unit for detecting a light emission state of the output light for each of the output display quantum dots, a control light supply unit capable of supplying a control light to each of the output display quantum dots to excite other exciters to the lower level, and thereby controlling energy discharging of the exciters transiting to the lower level, and a feedback control unit for controlling a control light to be supplied by the control light supply unit for each of the output display quantum dots based on the light emission state of the output light for each of the output display quantum dot detected by the light detection unit and previously-input search problem information, wherein the feedback control unit repeatedly performs supply control of the control light thereby to finally display a search solution for the search problem information based on the light emission state of the output light from each of the output display quantum dots read by the light detection unit.

In order to solve the above problems, a solution searching system by quantum dots according to the present invention includes an energy supply quantum dot having an energy level where exciters are excited in response to a supplied input light, a plurality of output display quantum dots provided around the energy supply quantum dot, each of which is formed in a larger volume than the energy supply quantum dot, has a resonant level where exciters are injected from the energy level in the input quantum dot, and can emit an output light based on energy discharging of the exciters transiting from the resonant level to a first lower level, a plurality of outside contact quantum dots provided for the output display quantum dots, each of which is formed in a larger volume than the output display quantum dot, has an injected resonant level where exciters are injected from the resonant level in the output display quantum dot, and can emit an output light for outside contact based on energy discharging of the exciters transiting from the injected resonant level to a second lower level, a light detection unit for detecting a light emission state of the output light per each of the output display quantum dots, a plurality of select targets provided for the outside contact quantum dots, each of which operates under a preset condition to output a result in response to an outside contact output light emitted from the outside contact quantum dot, and a control light supply unit which supplies a control light to the outside contact quantum dot based on the result output from the select target, and excites other exciters to the second lower level to control energy discharging of the exciters transiting to the second lower level, wherein a solution indicating a select priority of the select targets is displayed based on the light emission state of the output light from each of the output display quantum dot finally read by the light detection unit after repeated supply control of the control light.

The present invention may be applied to any of the solution searching systems by quantum dots, and may be accomplished as a quantum dot device including the energy supply quantum dot and the output display quantum dots.

According to the present invention with the above structure, it is possible to cause quantum dots to search and solve a so-called satisfiability problem or the like for searching an assignment of variables meeting a given propositional logical formula. According to the present invention, the search solution can be found by a nanoscale device without a dominant diffraction limit of light. Since the exciters in the quantum dot move so fast, the quantum dot device for searching a solution is not controlled in its rate, and a search solution can be derived faster. An energy loss is not involved in the movement of the exciters, and thus the solution search can be realized at lower energy consumption.

BRIEF DESCRIPTION OF DRAWINGS

FIG. 3 is an energy level diagram of the respective quantum dots configuring the quantum dot device;

FIG. 9 is a diagram illustrating a propositional logical formula for making AND of given Boolean formulas F11 to F16 1 ("true");

FIG. 12 is a diagram illustrating an exemplary conventional adder circuit using quantum dots;

FIGS. 14A and 14B are diagrams illustrating an exemplary conventional NOT operation circuit using quantum dots.

DETAILED DESCRIPTION

A solution searching system by quantum dots according to a first embodiment of the present invention will be described below in detail with reference to the drawings.

Figure 1:
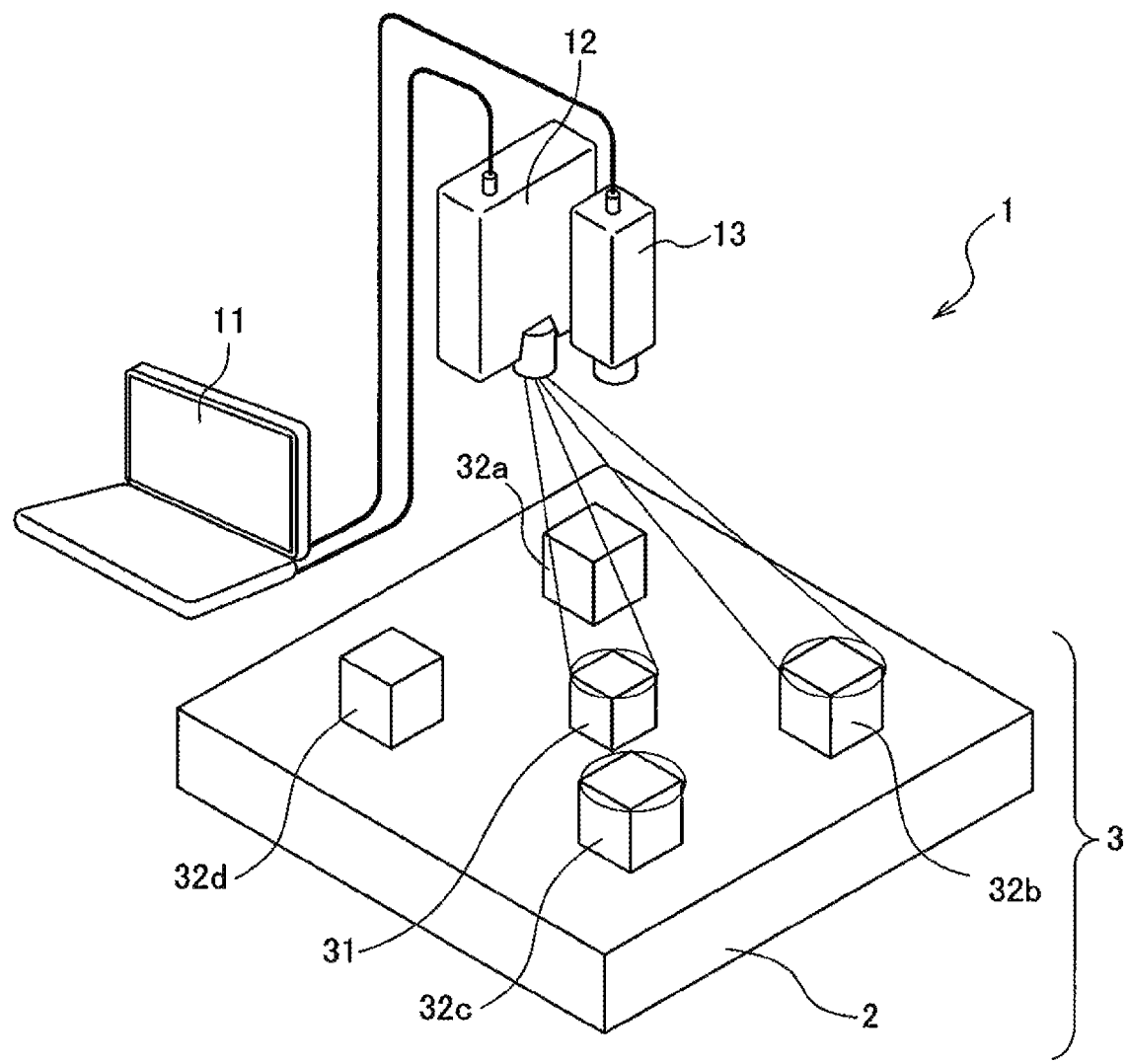
FIG. 1 is a diagram illustrating an entire structure of a solution searching system to which the present invention is applied.

FIG. 1 illustrates an entire structure of the solution searching system 1 to which the present invention is applied. The solution searching system 1 includes a quantum dot device 3 in which a quantum dot 31 having a small volume and a plurality of quantum dots 32 having a large volume are formed on a substrate 2, a light supply unit 12 capable of independently supplying lights to the quantum dots 31 and 32 configuring the quantum dot device 3, respectively, a light detection unit 13 for detecting a light emission state of the quantum dot device 3, and a personal computer (PC) 11 connected to the light supply unit 12 and the light detection unit 13.

The light detection unit 13 is configured of a video camera for capturing a light emission state of at least the quantum dots 32 in the quantum dot device 3 thereby to generate an image, or the like. The light detection unit 13 is determined in its positional relationship in order to capture at least the quantum dots 32. Additionally, the light detection unit 13 may be mounted with a magnifying lens (not illustrated) for magnifying the captured image. The light detection unit 13 is not limited to a video camera, and may be realized by any structure including a sensor such as photoelectric conversion element capable of detecting a light emission from the quantum dots 32.

The PC 11 analyzes the image captured by the light detection unit 13 in real-time thereby to detect a light emission state of each quantum dot 32 in the quantum dot device 3. The PC 11 performs so-called feedback control for controlling a control light to be supplied by the light supply unit 12 based on the light emission state of an output light of each quantum dot 32 and previously-input search problem information. The control light may be independently supplied per quantum dot 32. The PC 11 reads the light emission state of the output light of each quantum dot 32 and displays it on a display unit such as monitor.

Figure 2:
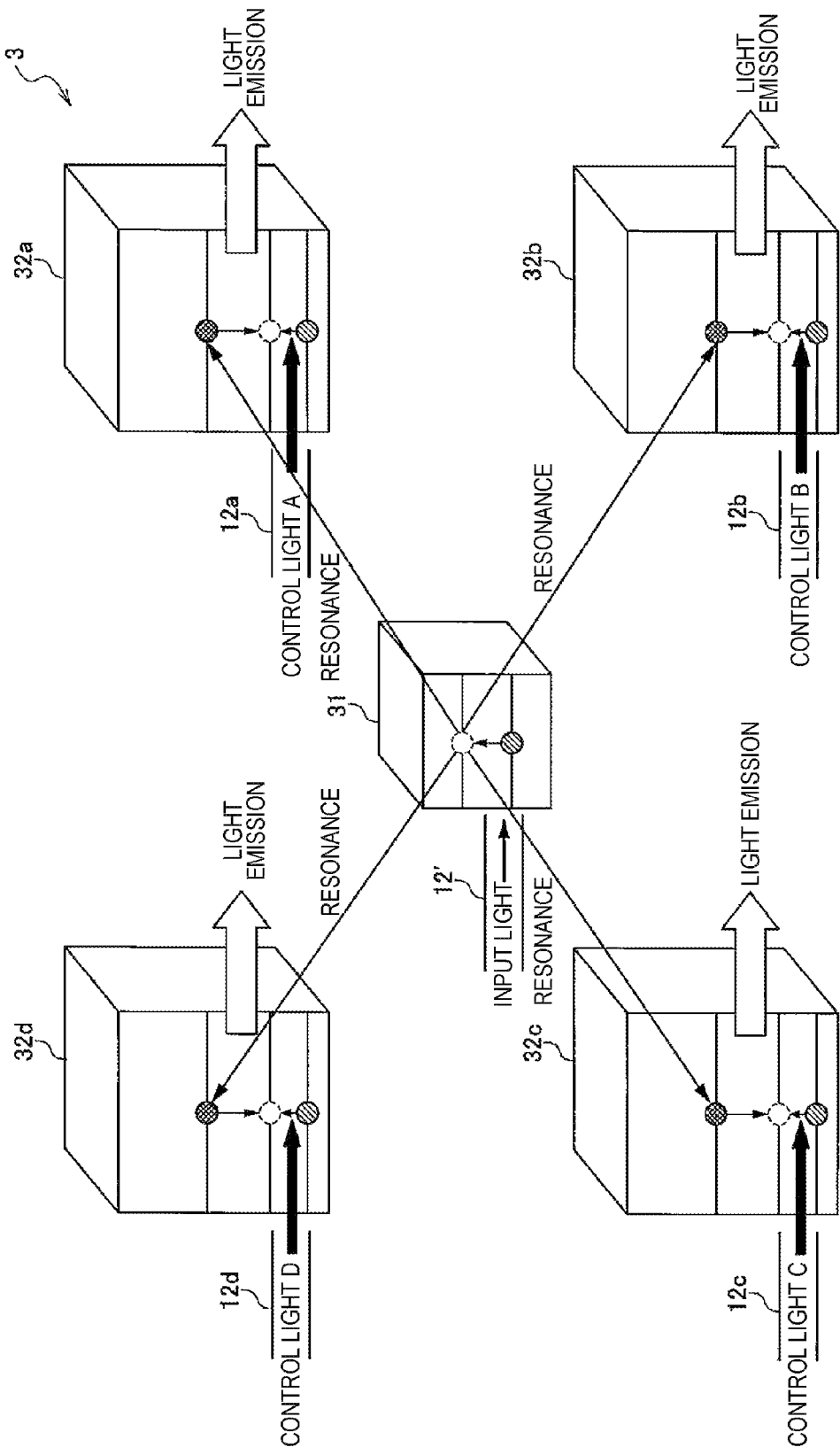
FIG. 2 is a diagram for explaining a structure of a quantum dot device.

The quantum dot device 3 is formed such that the quantum dots 32 having a large volume are formed around the quantum dot 31 having a small volume as illustrated in FIG. 2, for example. The embodiment will be described by use of four quantum dots 32a to 32d, but is not limited thereto.

The quantum dot 31 is supplied with a propagation light as an input light via a light supply unit 12' made of a plasmon waveguide. The quantum dot 32a is supplied with a propagation light as a control light A via a light supply unit 12a made of a plasmon waveguide. The quantum dot 32b is supplied with a propagation light as a control light B via a light supply unit 12b made of a plasmon waveguide. The quantum dot 32c is supplied with a propagation light as a control light C via a light supply unit 12c made of a plasmon waveguide. The quantum dot 32d is supplied with a propagation light as a control light D via a light supply unit 12d made of a plasmon waveguide. The light supply units 12 include a means for illuminating a propagation light from above on the plasmon waveguide, but are not limited thereto, and may be replaced with any means capable of supplying a propagation light such as transmission path by quantum dots, or optical fiber probe.

The quantum dot 31 is always supplied with a propagation light as an input light via the light supply unit 12' under control of the PC 11. The quantum dots 31 and 32a to 32d are independently supplied with the propagation lights as control lights via the light supply units 12a to 12d, respectively, or stop being supplied under control of the PC 11.

Each quantum dot 31, 32 is made of a material such as CuCl, GaN or ZnO. When the material making each quantum dot 31, 32 is CuCl, the quantum dots are formed in a cubic shape, and when the material making each quantum dot 31, 32 is GaN or ZnO, the quantum dots are formed in a spherical shape or a disk shape. The sides or diameter of each quantum dot 31, 32 may be formed at 4 nm to 10 nm, respectively, and may be formed on the substrate in a smaller size than a diffraction limit of light.

There the quantum dots 31 and 32 are formed in a cubic shape, assuming that the side length of the quantum dot 31, 32 is L, the height of the quantum dot 31, 32 is 2 L.

Each quantum dot 31, 32 may be fabricated on the substrate in the Bridgeman method or molecular beam epitaxy (MBE) growth method, or a quantum dot forming position may be controlled with excellent accuracy by use of near-field light CVD.

Assuming that a mass of a particle is m and a side length of the quantum dot 31, 32 is L, an energy level $E(n_x, n_y, n_z)$ in each quantum dot 31, 32 is defined by the following equation (1).

$$E(n_x,n_y,n_z)=h^2/8\pi^2 m(\pi/L)^2(n_x^2+n_y^2+n_z^2) \quad (1)$$

In the present invention, other typical energy level equations may be applied in addition to the energy level $E(n_x, n_y, n_z)$ defined in the equation (1) depending on a shape or material of the quantum dot.

$E(n_x, n_y, n_z)$ of each quantum dot 31, 32 is calculated based on the equation (1). When a ratio of the side lengths between the quantum dot 31 and the quantum dot 32 is about 1:2, as illustrated in FIG. 3, E(111) when the energy level is (1, 1, 1) in the quantum dot 31 is equal to E(222) when the energy level is (2, 2, 2) in the quantum dot 32. That is, the energy level (1, 1, 1) in the quantum dot 31 and the energy level (2, 2, 2) in the quantum dot 32 are in a relationship in which the excitation energy levels of the respective exciters are resonant.

In the present invention, the quantum dot 31 having a small volume is assumed as an energy supply quantum dot, and always supplies an input light. The input light to be supplied excites exciters to the energy level at a frequency ω1 corresponding to E(111) when the energy level is (1, 1, 1) in the quantum dot 31. When the exciters are excited at the energy level (1, 1, 1) in the quantum dot 31, a resonance occurs between the energy level (1, 1, 1) and the energy levels (2, 2, 2) equal thereto in other quantum dots 32a to 32d. Consequently, the exciters present at the energy level (1, 1, 1) in the quantum dot 31 move to the energy levels (2, 2, 2) in the quantum dots 32a to 32d. Consequently, the exciters apparently move from the quantum dot 31 to the quantum dots 32. The exciters moved to the energy level (2, 2, 2) move to E(211) at a lower level such as an energy level (2, 1, 1). Output lights are emitted from the quantum dots 32a to 32d during the transition from E(222) to E(211).

That is, the light with the frequency ω1 keeps being supplied to the quantum dot 31 so that the exciters keep moving to the quantum dots 32 via the resonance and consequently the output lights are emitted from the quantum dots 32a to 32d, respectively. A wavelength of the output lights is at frequency ω2 corresponding to an energy gap between the energy level (2, 2, 2) and the energy level (2, 1, 1) in the quantum dot 32. Thus, the frequency ω2 of the output lights is different from the frequency ω1 of the input light, and thus only the output lights can be detected independently of the input light.

When a control light at a frequency ω3 corresponding to the energy gap between the energy level (2, 1, 1) and the energy level (1, 1, 1) in the quantum dot 32 is illuminated on the quantum dots 32a to 32d, the exciters based on the control light can be excited on the energy level (2, 1, 1) in the quantum dot 32. It is assumed that the exciters transit to the energy level (2, 1, 1) in the quantum dot 32 from the upper energy level (2, 2, 2). Thus, when the energy level (2, 1, 1) in the quantum dot 32 is filled with the exciters excited by the control light, the exciters are inhibited from transiting from the upper energy level (2, 2, 2). That is, when the quantum dot 32 is supplied with the control light at the frequency ω3, other exciters are excited and filled at the energy level (2, 1, 1) in the quantum dot 32 so that energy discharging of the exciters transiting from the energy level (2, 2, 2) to the energy level (2, 1, 1) can be restricted. Consequently, a light emission intensity of the output light from the quantum dot 32 can be lowered based on the energy discharging of the exciters.

To the contrary, when the control light at the frequency ω3 corresponding to the energy gap between the energy level (2, 1, 1) and the energy level (1, 1, 1) in the quantum dot 32 is not illuminated on the quantum dots 32a to 32d, the exciters based on the control light are not excited on the energy level (2, 1, 1) in the quantum dot 32. That is, since the energy level (2, 1, 1) in the quantum dot 32 is not filled with the exciters excited by the control light, the exciters from the upper energy level (2, 2, 2) are not inhibited from transiting. That is, the quantum dot 32 is not supplied with the control light at the frequency ω3 so that energy discharging of the exciters transiting from the energy level (2, 2, 2) to the energy level (2, 1, 1) can be promoted by the released energy level (2, 1, 1) in the quantum dot 32. Consequently, the light emission intensity of the output light from the quantum dot 32 can be increased based on the energy discharging of the exciters.

When the quantum dot device 3 keeps being supplied with an input light and a control light is not supplied to any of the quantum dots 32a to 32d, the exciters excited in the quantum dot 31 randomly move to any of the quantum dots 32a to 32d so that an output light keeps emitting from the quantum dots 32a to 32d, and the operation is repeatedly performed in a time sequence manner so that the output light apparently emits from all the quantum dots 32a to 32d. To the contrary, when a control light is supplied to any one or more quantum dots 32a to 32d, the output lights from the quantum dots 32a to 32d supplied with the control lights can be prevented from emitting. Thus, a control light is not supplied to the quantum dots 32 to be emitted, thereby promoting the output lights to emit based on the above mechanism. When a control light is supplied to the quantum dots 32 to be prevented from emitting, the output lights can be prevented from emitting based on the above mechanism. The control light can be independently supplied per quantum dot 32a to 32d under control of the PC 11, and thus the quantum dots 32 to be emitted and the quantum dots 32 to be prevented from emitting can be independently controlled via the supplied control lights. Thereby, the quantum dots 32a to 32d have been randomly emitted, but with the control, the quantum dots 32 to be intentionally emitted and the quantum dots not to be intentionally emitted can be created on purpose.

Figure 4A:
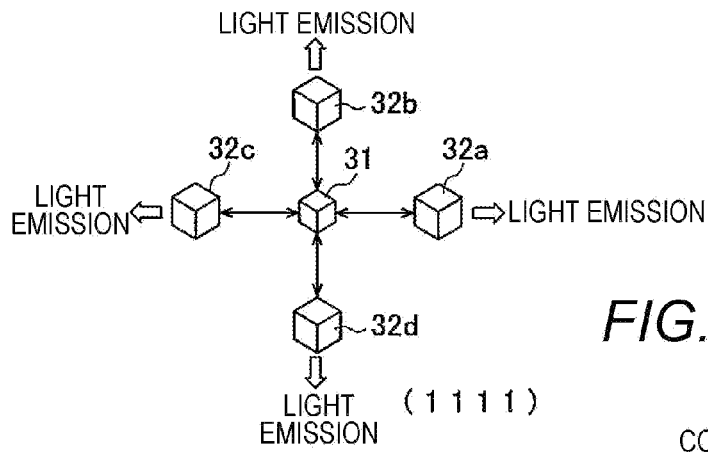
FIGS. 4A-4E are diagrams for explaining supply control of a control light to each quantum dot.
Figure 4B:
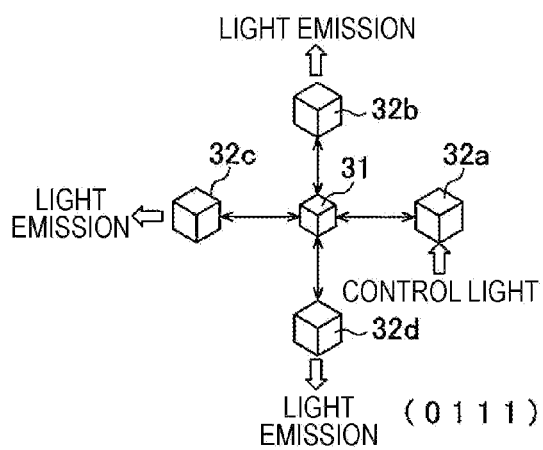
Figure 4C:
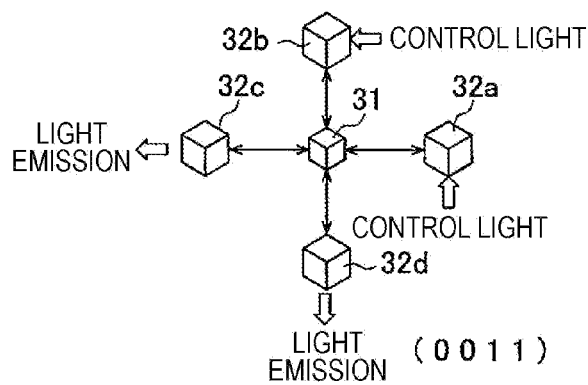
Figure 4D:
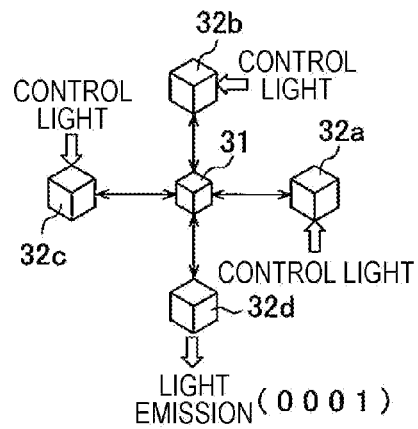
Figure 4E:
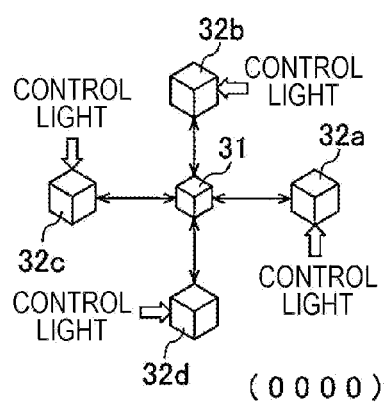

To the contrary, the quantum dot device 3 can individually supply a control light to the quantum dots 32a to 32d to stop emitting a light. For example, as illustrated in FIG. 4A, when all the quantum dots 32a to 32d are to be emitted, a control light will not be supplied to any of the quantum dots 32a to 32d. For example, as illustrated in FIG. 4B, when the quantum dot 32a is prevented from emitting and the quantum dots 32b to 32d are to be emitted, a control light is supplied to only the quantum dot 32a, and a control light is not supplied to the remaining quantum dots 32b to 32d. For example, as illustrated in FIG. 4C, when the quantum dots 32a and 32b are prevented from emitting and the quantum dots 32c and 32d are to be emitted, a control light is supplied to the quantum dots 32a and 32b and a control light is not supplied to the remaining quantum dots 32c and 32d. For example, as illustrated in FIG. 4D, when the quantum dots 32a to 32c are prevented from emitting and the quantum dot 32d is to be emitted, a control light is supplied to the quantum dots 32a to 32c and a control light is not supplied to the remaining quantum dot 32d. For example, as illustrated in FIG. 4E, when all the quantum dots 32a to 32d are prevented from emitting, a control light is supplied to all the quantum dots 32a to 32d.

The light emission states of the quantum dots 32a to 32d can be detected via the light detection unit 13. The light emission state of each quantum dot 32a to 32d detected by the light detection unit 13 is sent to the PC 11. Thereby, the PC 11 can identify the light emission state of each quantum dot 32a to 32d.

There has been described in the embodiment the case in which the quantum dot 31 and the quantum dots 32a to 32d are made of single quantum dots, but the embodiment is not limited thereto. The quantum dot 31 may be configured of a plurality of quantum dots having the same operation and each quantum dot 32a to 32d may be configured of quantum dots having the same operation.

The PC 11 binarizes the light emission intensity of the output light of each quantum dot 32a to 32d so that the output light may indicate each bit of a digital signal. In this case, a determination is made as to whether the light emission intensity of the output light detected by the light detection unit 13 exceeds a predetermined threshold. When the state in which the light emission intensity of the output light exceeds the predetermined threshold is assumed as H level, and the state in which the light emission intensity of the output light is equal to or less than the predetermined threshold is assumed as L level. The H level may be assumed as true ("1" for digital signal) and the L level may be assumed as false ("0" for digital signal).

At this time, a bit of the digital signal may be assigned to each quantum dot 32a to 32d. In this case, assuming that a digital signal ($a_0, a_1, a_2, a_3$) is assigned to the quantum dot 32a to the quantum dot 32d in this order, all the quantum dots 32a to 32d are at the H level and thus FIG. 4A indicates (1111), for example. Similarly, only the quantum dot 32a is at the L level and the remaining quantum dots 32b to 32d are at the H level and thus FIG. 4B indicates (0111). Similarly, the quantum dots 32a and 32b are at the L level and the quantum dots 32c and 32d are at the H level and thus FIG. 4C indicates (0011). Similarly, the quantum dots 32a to 32c are at the L level and the quantum dot 32d is at the H level and thus FIG. 4D indicates (0001). Similarly, the quantum dots 32a to 32d are at the L level and thus FIG. 4E indicates (0000).

In this way, the present invention can express a 4-bit digital signal by the outputs of the four quantum dots 32a to 32d. That is, in the form, when an N-bit digital signal is to be expressed, N quantum dots 32 need to be formed.

Figure 5:
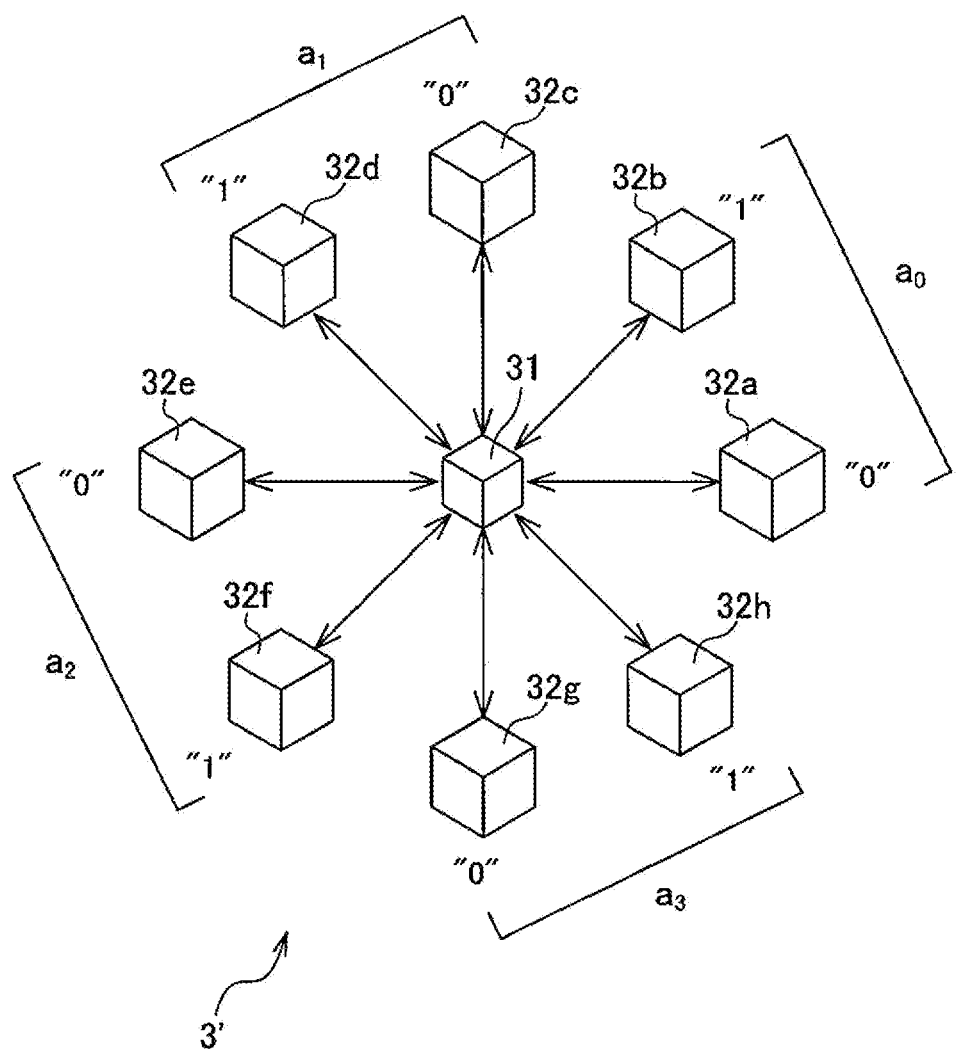
FIG. 5 is a diagram illustrating an example in which 2N quantum dots are formed and are assigned for expressing an N-bit digital signal.

FIG. 5 illustrates an example in which a quantum dot device 3' for expressing a 4-bit digital signal by the outputs of eight quantum dots 32a to 32h is used. When expressing an N-bit digital signal, the quantum dot device 3' forms and assigns 2N quantum dots 32. In this example, a pair of two quantum dots 32a and 32b expresses one bit $a_0$. A pair of two quantum dots 32c and 32d expresses one bit $a_1$. A pair of two quantum dots 32e and 32f expresses one bit $a_2$. A pair of two quantum dots 32g and 32h expresses one bit $a_3$. At the bits $a_1$ to $a_3$, the quantum dots 32a, 32c, 32e and 32g indicate "0", respectively, and the quantum dots 32b, 32d, 32f and 32h indicate "1", respectively.

When a control light is controlled to be supplied to the quantum dots 32a to 32h in the quantum dot device 3', based on the above mechanism, the exciters are excited and filled for E(211) in the quantum dots 32 so that energy discharging of the exciters transiting to E(211) is restricted thereby to lower the light emission intensity of the output light. Consequently, the light emission intensity of the resultant output light is set to be equal to or less than the threshold, and then is controlled not to correspond to "1" ("true") or "0" ("false") for a digital signal. Similarly, a control light is controlled not to be supplied to the quantum dots 32a to 32h, based on the above mechanism, E(211) can be released in the quantum dots 32, and the energy discharging of the exciters transiting to E(211) is promoted thereby to increase the light emission intensity of the output light. Consequently, the light emission intensity of the resultant output light exceeds the threshold and then is controlled to correspond to "1" ("true") or "0" ("false") for digital signal.

Figure 6A:
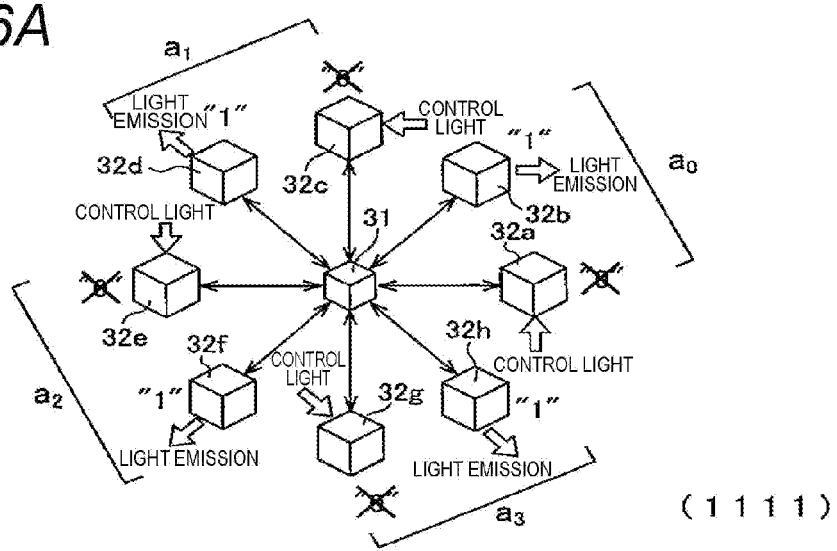
FIGS. 6A-6C are diagrams for explaining supply control of a control light in the quantum dot device illustrated in FIG. 5.
Figure 6B:
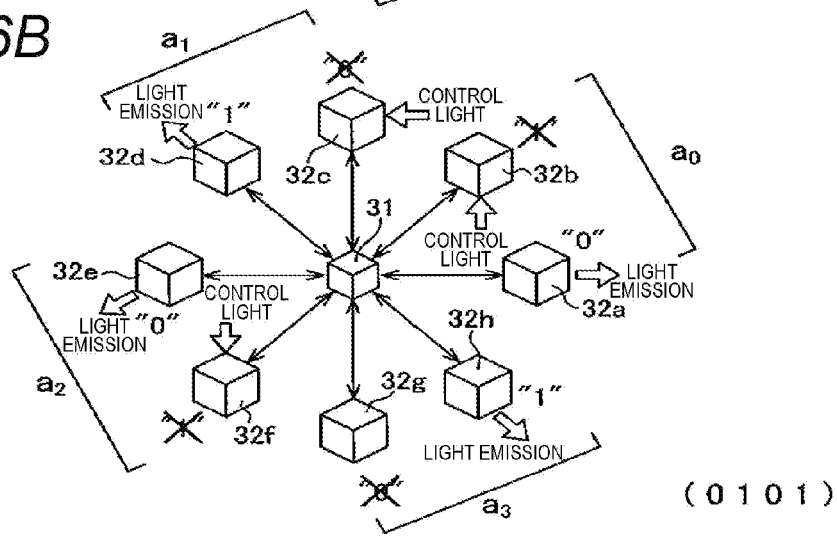
Figure 6C:
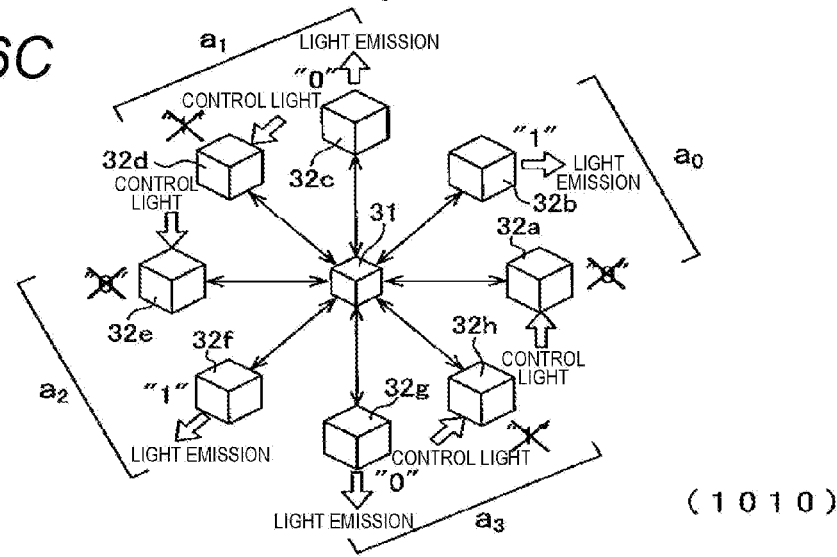

When a 4-bit digital signal is to be expressed by the quantum dot device 3', for example, as illustrated in FIG. 6A, a control light is supplied to the quantum dots 32a, 32c, 32e and 32g and a control light is not supplied to the quantum dots 32b, 32d, 32f and 32h. In this case, the quantum dots 32b, 32d, 32f and 32h emit a light to enter the H level, and thus the digital signal is (1111). As illustrated in FIG. 6B, a control light is supplied to the quantum dots 32b, 32c, 32f and 32g and a control light is not supplied to the quantum dots 32a, 32d, 32e and 32h. In this case, the quantum dots 32a, 32d, 32e and 32h emit a light to enter the H level, and thus the digital signal is (0101). As illustrated in FIG. 6C, a control light is supplied to the quantum dots 32a, 32d, 32e and 32h, and a control light is not supplied to the quantum dots 32b, 32c, 32f and 32g. In this case, the quantum dots 32b, 32c, 32f and 32g emit a light to enter the H level, and thus the digital signal is (1010).

When both the paired quantum dots 32 forming one bit emit a light or are prevented from emitting a light in the quantum dot device 3', whether the resultant digital signal takes 0 or 1 is unclear. Thus, in order not to create such a light emission state, a control light to be supplied is controlled such that either one of the paired quantum dots 32 forming one bit is emitted and the other is not emitted.

The PC 11 reads the light emission intensities of the output lights of the quantum dots 32 as a digital signal. The resultant digital signal or information based on it may be displayed on a display unit or a control light to be supplied may be controlled via the light supply unit 12 based on the read digital signal. In this case, based on the read digital signal, the PC 11 controls to supply a control light to any of the quantum dots 32 or not to supply a control light to any of them. To which quantum dot 32 a control light is to be supplied is determined based on previously-input search problem information. In other words, the PC 11 controls a control light to be supplied to the quantum dots 32 based on two factors such as the digital signal based on the output lights from the quantum dots 32 and the previously-input search problem information.

The search problem information contains any problem information expressed in logical operation formulas. The search problem information may be considered as any problem information on an optimum solution search problem. The search problem information may be expressed in a propositional logical formula made of N variables, for example. The search problem information is expressed by $(p_0?p_1? \ldots ?p_n)=1$ or 0 (herein, ? may employ any operation symbols such as OR and AND).

Consider a case in which the search problem information is given F1: $x_1=\text{NOR}(x_4, x_2)$ and $x_2=\text{NOR}(x_1, x_3)$ and $x_3=\text{NOR}(x_2, x_4)$ and $x_4=\text{NOR}(x_3, x_1)$. $x_1$, $x_2$, $x_3$, and $x_4$ meeting the logical operation formula defined in the search problem information are to be searched. The solution is $(x_1, x_2, x_3, x_4)=(1, 0, 1, 0), (0, 1, 0, 1)$.

There will be considered a case in which the quantum dot device 3 for assigning N quantum dots to N variables as illustrated in FIG. 2 is used. The four variables are $x_1, x_2, x_3$ and $x_4$, and thus the four quantum dots 32a, 32b, 32c and 33d are used for searching a solution. It is assumed that the variable $x_1$ is assigned to the quantum dot 32a, the variable $x_2$ is assigned to the quantum dot 32b, the variable $x_3$ is assigned to the quantum dot 32c and the variable $x_4$ is assigned to the quantum dot 32d. In this case, the quantum dots 32a, 32b, 32c and 33d are annularly arranged in this order about the quantum dot 31.

As described above, the PC 11 controls a control light to be supplied to the quantum dots 32 based on the digital signal based on the output lights from the quantum dots 32 and the search problem information. Initially, an input light is supplied to the quantum dot 31 without supplying any control light, but in this case, the exciters randomly move from the quantum dot 31 to the quantum dots 32a to 32d. Thereafter, however, the lights emitted from the quantum dots 32 are gradually controlled based on the search problem information including the NOR problem.

In order to actually solve the NOR problem to which four variables are given, the following rules are contained in the search problem information.

For one quantum dot of interest, when the output lights from other quantum dots 32 adjacent thereto are emitted, a control light is supplied to the quantum dot 32 of interest thereby to restrict the output lights from emitting. In other words, for a signal $x_i$ based on the light emission from one quantum dot 32i, when a signal $x_{i-1}$ based on the light emission from the adjacent quantum dot 32i−1 is "1" or when a signal $x_{i+1}$ based on the light emission from the adjacent quantum dot 32i+1 is "1", a control light is supplied to the quantum dot 32i such that the quantum dot 32i is deactivated, thereby restricting light emission. Thereby, the output of the signal $x_i$ is controlled to be 0.

For one quantum dot of interest, when an output light is not emitted from both the quantum dots 32 adjacent thereto, a control light is not supplied to the quantum dot 32 of interest so that the quantum dot 32 does not restrict the light emission of the output lights. In other words, for a signal $x_i$ based on the light emission from one quantum dot 32i, when the signal $x_{i-1}$ based on the light emission of the adjacent quantum dot 32i−1 is "0" and when the signal $x_{i+1}$ based on the light emission from the adjacent quantum dot 32i+1 is "0", the quantum dot 32i is not prevented from emitting in order to activate the quantum dot 32i. Thereby, the outputs of the signal $x_{i-1}$ and the signal $x_{i+1}$ are controlled to be 1.

The above rules are assumed as the problem search information so that a state arrangement meeting $x_1=\text{NOR}(x_4, x_2)$ and $x_2=\text{NOR}(x_4, x_3)$ and $x_3=\text{NOR}(x_2, x_4)$ and $x_4=\text{NOR}(x_3, x_1)$ is searched.

Figure 7A:
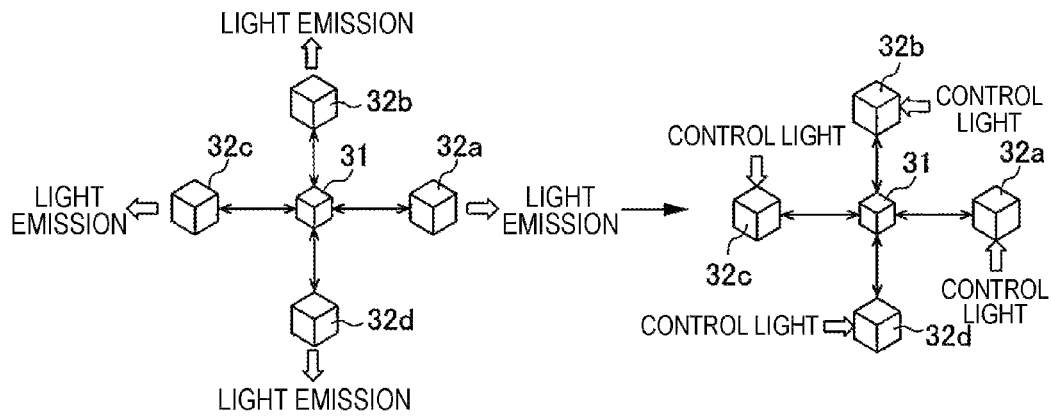
FIGS. 7A-7C are diagrams illustrating an example in which a solution of NOR problem is searched for a quantum dot device for assigning N quantum dots to N variables.

At first, as illustrated in FIG. 7A, when all the quantum dots 32a to 32d emit a light, for each quantum dot 32a to 32d of interest, any one or more of both the adjacent quantum dots 32 emit an output light. Thus, as illustrated in FIG. 7A, a control light is supplied to all the quantum dots 32a to 32d.

Figure 7B:
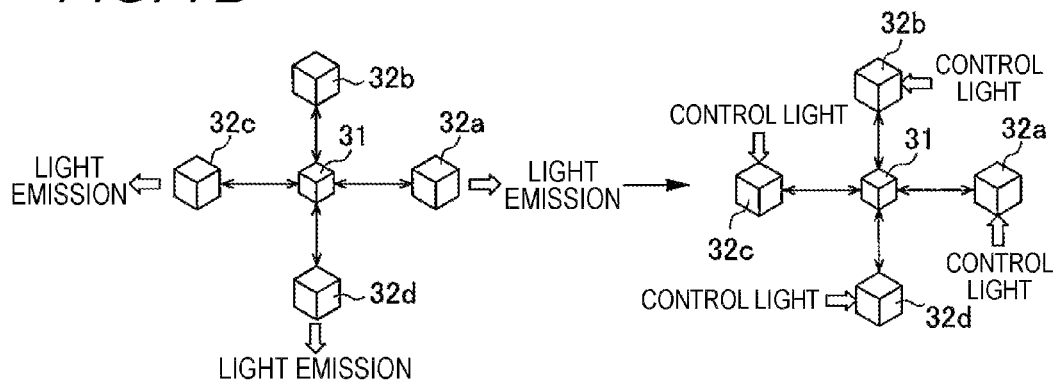

Similarly, as illustrated in FIG. 7B, when the quantum dots 32a, 32c and 32d emit a light, for each quantum dot 32a to 32d of interest, any one or more of both the adjacent quantum dots 32 emit an output light. Thus, as illustrated in FIG. 7B, a control light is supplied to all the quantum dots 32a to 32d.

Figure 7C:
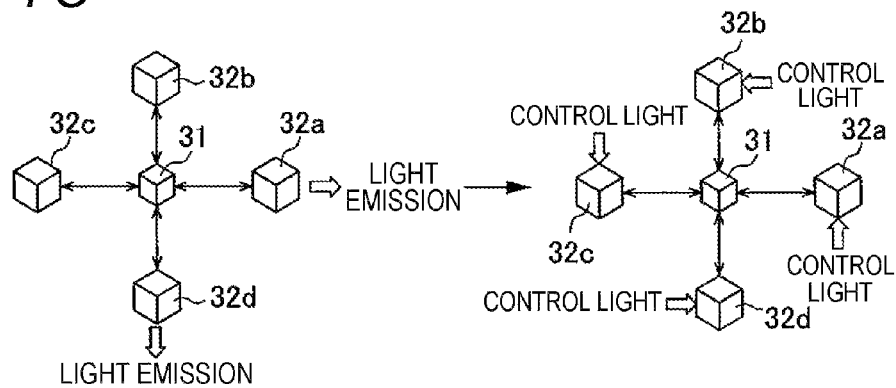

Similarly, as illustrated in FIG. 7C, when the quantum dots 32a and 32d emit a light, for each quantum dot 32a to 32d of interest, any one or more of both the adjacent quantum dots 32 emit an output light. Thus, as illustrated in FIG. 7C, a control light is supplied to all the quantum dots 32a to 32d.

Figure 8A:
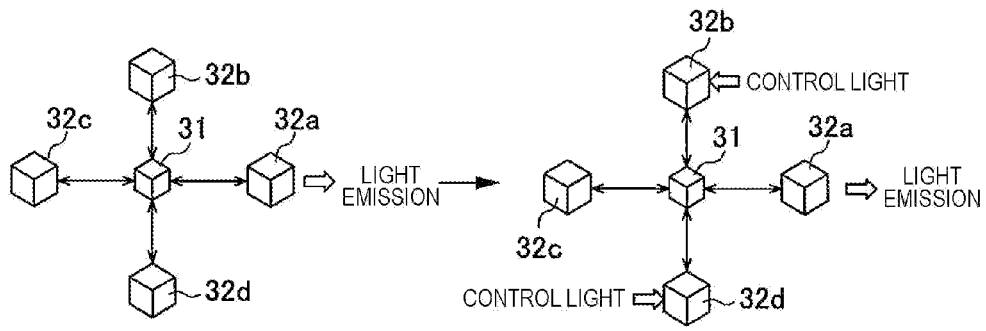
FIGS. 8A-8C are diagrams illustrating an example in which a solution of NOR problem is searched for a quantum dot device for assigning 2N quantum dots to N variables.

As illustrated in FIG. 8A, when the quantum dot 32a emits a light, for each quantum dot 32a to 32d of interest, any one or more of both the adjacent quantum dots 32b and 32d emit an output light. Thus, as illustrated in FIG. 8A, a control light is supplied to the quantum dots 32b and 32d.

Figure 8B:
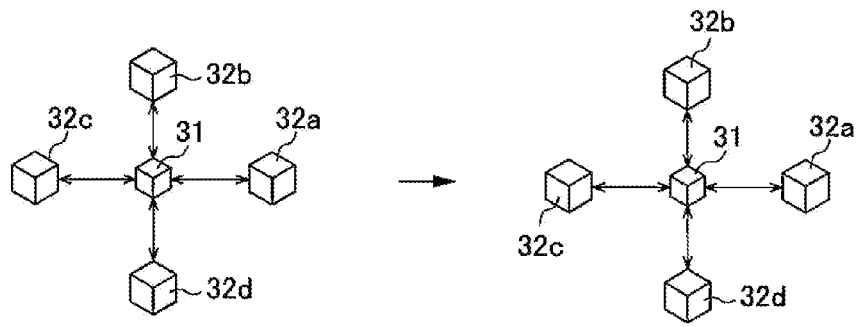

As illustrated in FIG. 8B, when no quantum dot 32a to 32d emits a light, for each quantum dot 32a to 32d of interest, there is not a quantum dot any one or more of both the quantum dots 32 of which emit an output light. Thus, as illustrated in FIG. 8B, a control light is not supplied to all the quantum dots 32a to 32d.

Figure 8C:
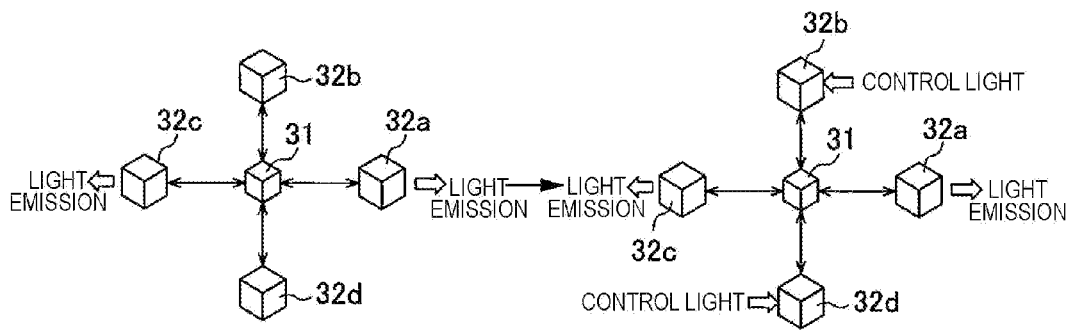

As illustrated in FIG. 8C, when the quantum dots 32a and 32c emit a light, for each quantum dot 32a to 32d of interest, any one or more of both the adjacent quantum dots 32 of the quantum dots 32b and 32d emit an output light. Thus, as illustrated in FIG. 8C, a control light is supplied to the quantum dots 32b and 32d. The processing is repeatedly performed so that when a control light is supplied to the emitting quantum dot 32, the light emission from the quantum dot 32 is restricted later. When a control light is not supplied to the non-emitting quantum dot 32, an output light is emitted from the quantum dot 32 later. That is, the states when a control light is supplied to the emitting quantum dot 32 and when a control light is not supplied to the non-emitting quantum dot 32 are to transit later, and thus are not stable but unstable.

To the contrary, the light emission states when a control light is not supplied to the emitting quantum dot 32 and when a control light is supplied to the non-emitting quantum dot 32 do not transit to other light emission states, and will be stable later.

The flow is repeatedly performed to finally reach a stable state. FIGS. 7A to 7C and FIGS. 8A and 8B are unstable, and FIG. 8C is stable. Such a stable state is reached only when the digital signal based on the output states from the quantum dots 32 is $(x_1, x_2, x_3, x_4)=(1, 0, 1, 0), (0, 1, 0, 1)$, which is a search solution for the search problem information.

The search problem information has employed NOR with four variables, but is not limited thereto, and any other propositional logical formulas may be searched by the quantum dot device 3, 3', thereby deriving a final search solution. In order to cause the quantum dot device 3, 3' to find a search solution of the search problem information, a control light to be supplied to the quantum dots 32 is controlled such that a search solution not meeting the propositional logical formula as the search problem information is eliminated depending on "true" or "false" based on the light emission state of each output light. By use of it, a satisfiability problem (SAT) for searching a satisfiable variable is given as search problem information, for example, to make the entire values of the propositional logical formula "true", thereby finding the search solution.

For example, FIG. 9 illustrates a proportional logical formula for making AND of given Boolean formulas F11 to F16 1 ("true"). It can be seen that each term has to be 1 in order to obtain AND of 1. For the F11 of interest, assuming $x_1=0$, F11 cannot be 1 if $x_2$ is not set at "0." In this case, $x_2$="1" is canceled and needs to be "0." When $x_2$ is "1", F11 cannot be "1" when $x_1$ is 0. In this case, $x_1$="0" is canceled and needs to be "1."

For the F12 of interest, when $x_3$ is 0 and $x_4$ is 1, F12 cannot be "1" when $x_2$ is 1. In this case, $x_2$="1" is canceled and needs to be "0." Similarly, when $x_2$ is 1 and $x_3$ is 0, F12 cannot be "1" when $x_4$ is 1. In this case, $x_4$="1" is canceled and needs to be "0." Similarly, when $x_2$ is 1 and $x_4$ is 1, F12 cannot be "1" when $x_3$ is 0. In this case, $x_3$="0" is canceled and needs to be "1."

In order to make the entire value of the propositional logical formula "true" for the remaining F13 to F16 based on the same logic, the values not meeting the propositional logical formula are eliminated. Thereby, the entire value of the propositional logic formula can be made "true."

For such solution searching, in the solution searching system 1 by quantum dots to which the present invention is applied, a digital signal based on the light emission state of each output light is obtained, and a control light can be supplied to each quantum dot 32 such that a quantum dot not meeting the propositional logical formula as search problem information is eliminated depending on the digital signal. Thus, the search problem information made of the propositional logical formula illustrated in FIG. 9 is given so that a control light is supplied to finally reach alight emission state (case 1) of an output light from a quantum dot meeting the propositional logical formula as the search problem information.

Also when the propositional logical formula including a plurality of node logical formulas made of F11 to F16 as illustrated in FIG. 9 is to be solved, it is input as search problem information in the PC 11 so that a control light to be supplied is controlled according to the search problem information, thereby reaching a search solution.

The search solution of the propositional logic formula illustrated in FIG. 9 is $(x_1, x_2, x_3, x_4)=(1, 1, 1, 1)$, but the satisfiability problem can be searched and solved via the quantum dot device 3, 3' in the solution searching system 1 to which the present invention is applied. Particularly, the satisfiability problem is used in many applications such as software and hardware verifications as well as computer support design, and will be more important, but a search solution can be solved in a nanoscale device without a dominant diffraction limit of light. Since the exciters move in the quantum dots 31 and 32 so fast, the quantum dot device 3 for searching a solution is not controlled in its rate, and a search solution can be derived faster.

According to the present invention, if any other propositional logical formula is previously input into the PC 11 for the satisfiability problem, its search solution can be obtained with the same method.

There has been described in the embodiment the case in which the quantum dot device 3, 3' is subjected to feedback control by use of the CPU (Central Processing Unit) of the PC 11 based on the given satisfiability problem and the digital signal based on the light outputs from the quantum dots 32. That is, there has been described the case in which the CPU of the PC 11 has a process of identifying the satisfiability problem from the digital signal based on the light outputs from the quantum dots 32 for determination. However, the present invention is not limited to the embodiment, and may introduce a so-called switch means uniquely operating via the light outputs from the total quantum dots 32, and may perform feedback control based on the control lights. That is, the CPU of the PC 11 may mechanically perform feedback control without introducing the process of identifying the satisfiability problem from the digital signal based on the light outputs from the quantum dots 32 for determination.

The unique control can be realized by the quantum dot device 3' in which 2N quantum dots 32 are formed for expressing an N-bit digital signal. The unique control can be preferably realized when the search problem information is 3CNF (3SAT problem) in the satisfiability problem. 3CNF is called conjunctive normal form, and is such that the entire propositional logical formula including a plurality of node logical formulas made of F11 to F16 as illustrated in FIG. 9 is 1 and OR is formed of two or three variables in the nodes. Typically, the satisfiability problem can be converted into 3CNF. Thus, in order to perform unique control, an operation formula whose search solution is to be found needs to be converted into 3CNF.

The unique feedback control is performed based on the following three rules including INTRA, INTER and CONTRA.

INTRA is a rule for canceling a state in which both the paired quantum dots 32 forming one bit (variable) emit or a state in which both do not emit for the pair of interest in the quantum dot device 3'. A control light to be supplied is controlled such that any one of the paired quantum dots 32 forming one dot is emitted and an emitted light from the other quantum dot 32 is canceled.

TABLE 1

| INTRA | | | |
|---|---|---|---|
| P | | Q | |
| $x_1$ | 0 | $x_1$ | 1 |
| $x_1$ | 1 | $x_1$ | 0 |
| $x_2$ | 0 | $x_2$ | 1 |
| $x_2$ | 1 | $x_2$ | 0 |
| $x_3$ | 0 | $x_3$ | 1 |
| $x_3$ | 1 | $x_3$ | 0 |
| $x_4$ | 0 | $x_4$ | 1 |
| $x_4$ | 1 | $x_4$ | 0 |

| INTER | | | |
|---|---|---|---|
| P | | Q | |
| $x_2$ | 1 | $x_1$ | 0 |
| $x_1$ | 0 | $x_2$ | 1 |
| $x_3$ | 0 | $x_2$ | 1 |
| $x_4$ | 1 | | |
| $x_2$ | 1 | $x_3$ | 0 |
| $x_4$ | 1 | | |
| $x_2$ | 1 | $x_4$ | 1 |
| $x_3$ | 0 | | |
| $x_3$ | 0 | $x_1$ | 0 |
| $x_1$ | 0 | $x_3$ | 0 |
| $x_3$ | 1 | $x_2$ | 0 |
| $x_2$ | 0 | $x_3$ | 1 |
| $x_4$ | 1 | $x_3$ | 0 |
| $x_3$ | 0 | $x_4$ | 1 |
| $x_4$ | 0 | $x_1$ | 1 |
| $x_1$ | 1 | $x_4$ | 0 |

| CONTRA | | | | | | | |
|---|---|---|---|---|---|---|---|
| P | | Q | | | P | | Q |
| $x_2$ | 1 | $x_1$ | 0 | ⇔ | $x_4$ | 0 | $x_1$ | 1 |
| $x_3$ | 0 | $x_1$ | 0 | | | | | |

TABLE 1-continued

| P | | Q | | | P | | Q | |
|---|---|---|---|---|---|---|---|---|
| $x_3$ | 1 | $x_2$ | 0 | ⇔ | $x_1$ | 0 | $x_2$ | 1 |
| | | | | | $x_3$ | 0 | $x_2$ | 1 |
| | | | | | $x_4$ | 1 | | |

| P | | Q | | | P | | Q | |
|---|---|---|---|---|---|---|---|---|
| $x_2$ | 1 | $x_3$ | 0 | ⇔ | $x_2$ | 0 | $x_3$ | 1 |
| $x_4$ | 1 | | | | | | | |
| $x_1$ | 0 | $x_3$ | 0 | | | | | |
| $x_4$ | 1 | $x_3$ | 0 | | | | | |

| P | | Q | | | P | | Q | |
|---|---|---|---|---|---|---|---|---|
| $x_1$ | 1 | $x_4$ | 0 | ⇔ | $x_2$ | 1 | $x_4$ | 1 |
| | | | | | $x_3$ | 0 | | |
| | | | | | $x_3$ | 0 | $x_4$ | 1 |

Exemplary INTRA, INTER and CONTRA for performing feedback control are indicated in Table 1. All of INTRA, INTER and CONTRA are expressed as elements in the form of [P, Q] in Table 1. Both P and Q are the sets, and indicate that "when p is established, Q is prohibited." If the P and Q are compared to the light emission states of the quantum dots 32 in the quantum dot device 3', when a digital signal based on the light emission states from the quantum dots 32 corresponding to the variables is P, a control light is controlled to cancel a digital signal Q of the corresponding quantum dots.

At first, for INTRA, when $x_1$ is 0, a control light to be supplied is controlled to cancel $x_1=1$. When $x_1$ is 1, a control light to be supplied is controlled to cancel $x_1=0$. For the remaining $x_2$ to $x_4$, a control light to be supplied is controlled according to the INTRA table.

INTER is a rule for actually supplying a control light to the quantum dot 32 based on given search problem information. For example, for the F11 of interest in FIG. 9, when the quantum dot 32d corresponding to "1" of the quantum dot $x_2$ emits a light, a control light is supplied to the quantum dot 32a in order to prevent the quantum dot 32a corresponding to "0" of the quantum dot $x_1$ from emitting a light. Similarly, when the quantum dot 32a corresponding to "0" of the quantum dot $x_1$ emits a light, a control light is supplied to the quantum dot 32d in order to prevent the quantum dot 32d corresponding to "1" of the quantum dot $x_2$ from emitting a light.

In Table 1, INTER can be expressed as elements in the form of [P, Q]. When $x_2$ is 1 for P, a control light to be supplied is controlled to cancel $x_1=0$ indicated for Q. When $x_1$ is 0 for P, a control light to be supplied is controlled to cancel $x_2=1$ indicated for Q. When $x_3$ is 0 and $x_4$ is 1 for P, a control light to be supplied is controlled to cancel $x_2=1$ indicated for Q. This is applicable to the following, and a control light to be supplied is controlled according to the INTER Table.

In this way, for one variable of interest configuring a node, when OR with the other variable configuring the node is not "true" (in the above example, when one variable $x_2$ is 1 and the other variable $x_1$ is 0), INTER controls a control light to be supplied for canceling a light output state from the output display quantum dot 32 indicating the other variable ($x_1=0$). When "$x_1=0$" for the other variable is canceled, "$x_1=1$" can be derived. CONTRA is processing control for eliminating a logical contradiction occurring when a control light to be supplied is controlled for INTRA and INTER as described above.

At first, for $x_1$ of interest for Q, when $x_2$ is 1 and when a point $x_3$ for canceling $x_1=0$ is 0, a point for canceling $x_1=0$ is defined in INTER. When $x_4$ is 0, a point for canceling $x_1=1$ is defined. Thus, as indicated by CONTRA in Table 1, the point for canceling $x_1=0$ and the point for canceling $x_1=1$ are defined for Q. That is, it can be seen that $x_1$ can take neither 0 nor 1 and thus a logical contradiction occurs.

In this case, $x_2=1$ and $x_4=0$ are controlled not to occur at the same time. Similarly, $x_3=0$ and $x_4=0$ are controlled not to occur at the same time. Specifically, when $x_2$ is 1 and $x_4$ is 0, a control light is supplied to the corresponding quantum dot 32 to cancel the state, and similarly, when $x_3$ is 0 and $x_4$ is 0, a control light is supplied to the corresponding quantum dot 32 to cancel the state.

For example, for $x_3$ of interest for Q, when $x_2$ is 1 and $x_4$ is 1, a point for canceling $x_3=0$ is defined in INTER. Similarly, when $x_2$ is 0, a point for canceling $x_3=1$ is defined in INTER. Thus, it can be seen that $x_3$ can take neither 0 nor 1 and thus a logical contradiction occurs. Also in this case, similarly, $x_2=1$, $x_4=1$, and $x_2=0$ are controlled not to occur at the same time. Specifically, when $x_2$ is 1, $x_4$ is 1 and $x_2$ is 0, a control light is supplied to the corresponding quantum dot 32 to cancel the state.

Combinations of other $x_2$ to $x_4$ causing a logical contradiction are indicated for CONTRA in Table 1.

CONTRA pays attention to a pair of quantum dots indicating "true" and "false" of one variable in the process of controlling a control light to be supplied based on the search problem information. The logical contradiction occurs when the quantum dot 32 with $x_1$ corresponding to 0 and the quantum dot 32 with $x_1$ corresponding to 1 emit or can emit an output light at the same time for $x_1$ of interest. In this case, a control light to be supplied is controlled not to select the light emission state as a search solution.

With INTRA, INTER and CONTRA described above, a relationship between P and Q can be previously defined based on the search problem information. The Q state is canceled during P for INTRA and INTER and the above control is performed for CONTRA so that a search solution (1111) for the satisfiability problem (3SAT problem) defining the search problem information can be finally derived.

At least when a digital signal is present (for P) for controlling INTRA, INTER and CONTRA, a control light to be supplied has only to be controlled to cancel the state defined for Q, and thus feedback control may be performed by a control light via the light supply unit 12 by making use of a means such as so-called light switch or waveguide uniquely operating via a light output from the quantum dot 32 without using the PC 11. Thus, the present invention does not absolutely need the PC 11, and may be replaced with any feedback control means with no CPU.

Figure 10:
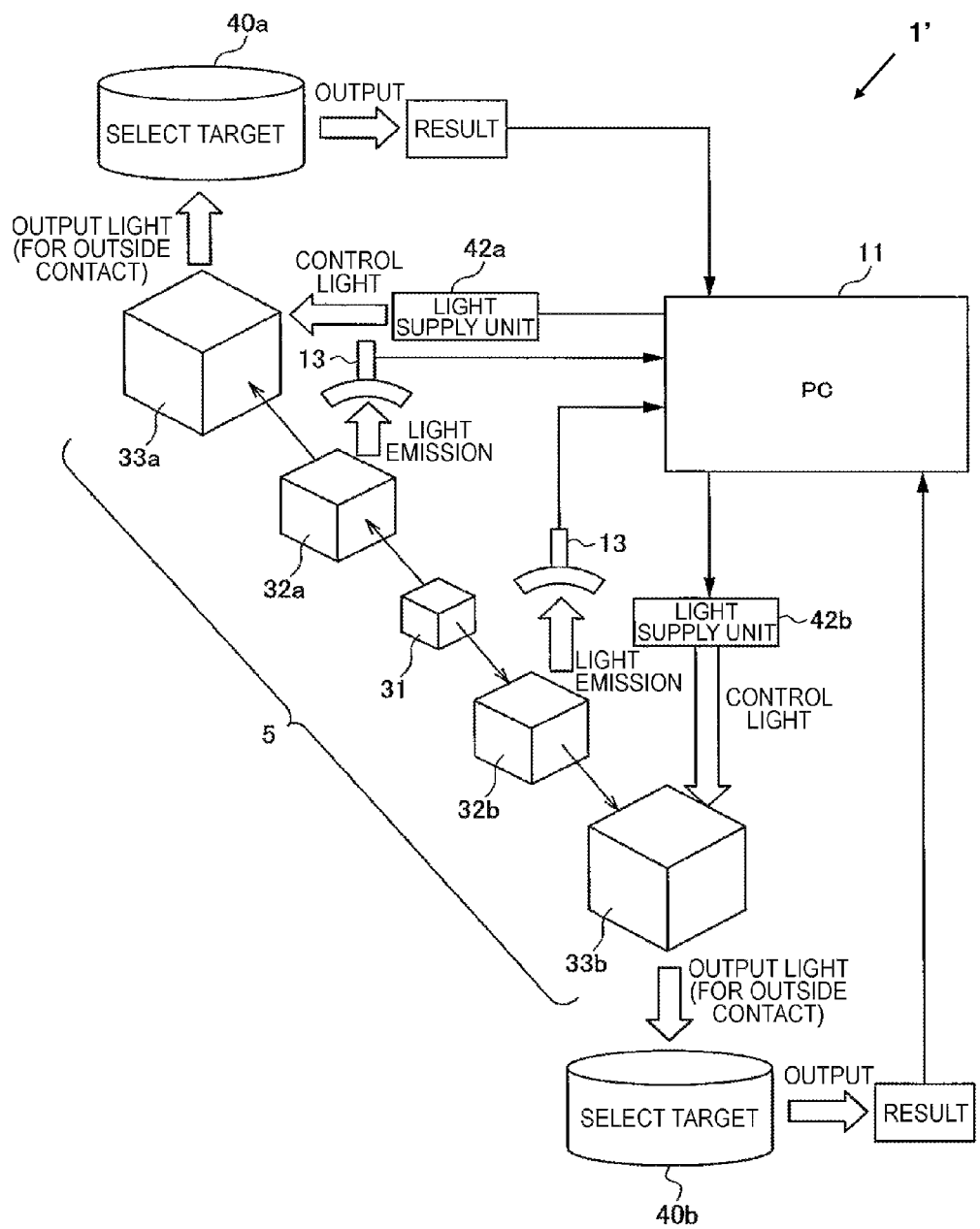
FIG. 10 is a diagram for explaining other embodiment of the solution searching system to which the present invention is applied.

The present invention may be implemented as a solution searching system 1' as illustrated in FIG. 10, for example. The solution searching system 1' includes a quantum dot device 5 including the quantum dot 31, the quantum dots 32, and quantum dots 33 having a larger volume than the quantum dots 32, a light supply unit 42 capable of independently supplying lights to the quantum dots 33 configuring the quantum dot device 5, the light detection unit 13 for detecting a light emission state of the quantum dot device 5, and the personal computer (PC) 11 connected to the light supply unit 42 and the light detection unit 13.

In the solution searching system 1', the same components and members as those in the solution searching system 1 are denoted with the same numerals and an explanation thereof will be omitted below.

Figure 11:
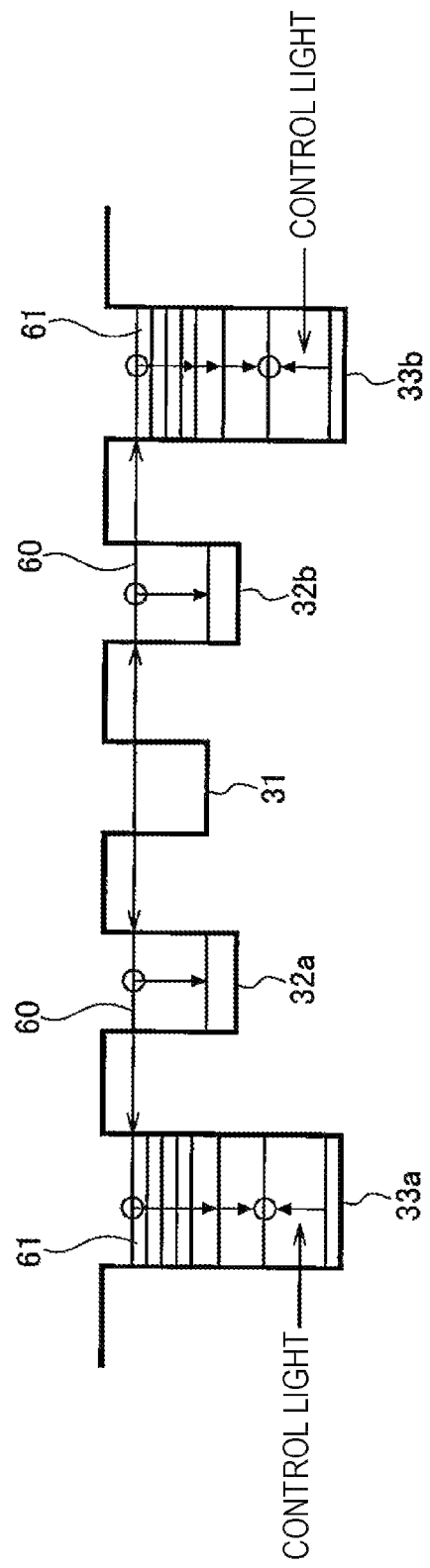
FIG. 11 is an energy level diagram of quantum dots configuring a quantum dot device used in the embodiment of FIG. 10.
Figure 13A:
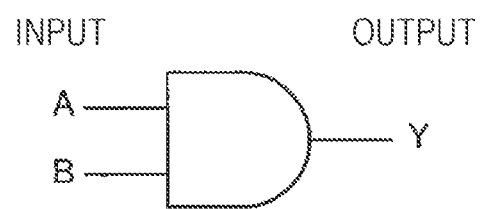
FIG. 13A is an arithmetic circuit diagram assuming so-called OR Y of signal intensities as an output for inputs A and B.
Figure 13B:
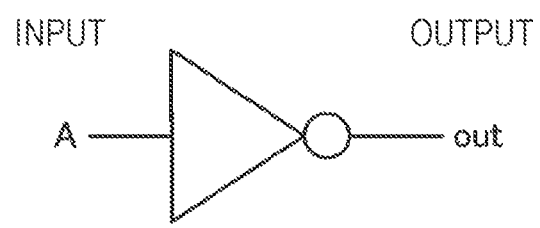
FIG. 13B is a NOT operation circuit diagram.

FIG. 11 illustrates the energy levels of the quantum dots 31 to 33 in the quantum dot device 5. The energy levels of the quantum dots 31 and 32 are the same as those in the quantum dot device 3. The quantum dot 33 has an injected resonant level 61 into which the exciters are injected from a resonant level 60 in the quantum dot 32, and can emit an output light for outside contact based on energy discharging of the exciters transited from the injected resonant level 61 to a lower level. The quantum dots 33 are so-called outside contact quantum dots provided for the quantum dots 32. That is, the quantum dot 33a is provided for the quantum dot 32a and the quantum dot 33b is provided for the quantum dot 32b.

A select target 40 may be configured of any target capable of operating under a preset condition and outputting a result. The select target 40 may be, for example, a slot machine for outputting a result of success compensation attainment randomly or with a predetermined probability in response to an operation instruction. That is, with the solution searching system 1', a user searches a solution as to which to select among a plurality of select targets 40. The select target 40 starts operating in response to an output light (for outside contact) from the quantum dot 33. With the explanation in the example of FIG. 10, the select target 40a starts operating in response to an output light (for outside contact) from the quantum dot 33a. The select target 40b starts operating in response to an output light (for outside contact) from the quantum dot 33b.

Additionally, a method for transmitting an emitted output light (for outside contact) to the select target 40 may employ any conventional method. A light emission of at least an output light (for outside contact) is detected and is photoelectrically converted to identify from which of the quantum dots 33a and 33b the detected light emission is, and an operation start signal is transmitted to the identified select target 40a, 40b.

The results output from the select targets 40 are sent to the PC 11 manually or automatically. The method for sending the output results from the select targets 40 to the PC 11 may be realized by any method with a capturing means such as camera.

The light supply unit 42 may employ any means capable of supplying a control light as a propagation light, such as optical fiber probe, plasmon waveguide or transmission path by quantum dots. The light supply unit 42 supplies a control light to the quantum dots 33 under control of the PC 11. The PC 11 may determine to which of the light supply units 42a and 42b a control light is supplied based on the results output from the select targets 40. At this time, when a result of "success compensation attainment" is obtained from the select target 40a, a control light may be supplied to the light supply unit 42a, and when a result of "success compensation attainment" is obtained from the select target 40b, a control light may be supplied to the light supply unit 42b.

A control light may be supplied to the light supply units 42 not via the PC 11. That is, a signal for starting light supply is transmitted depending on a result output from the select target 40 so that a light is supplied via the light supply unit 42.

The operations of the quantum dot device 5 will be described below.

At first, an input light is supplied to the quantum dot 31, and the exciters excited by the supplied input light move to the quantum dots 32a and 32b via the resonant levels. Initially, the exciters randomly move to any of the quantum dots 32a and 32b. The exciters moved to the quantum dot 32 move to the quantum dot 33 via the resonant level 60 and the injected resonant level 61. The exciters moved to the injected resonant level 61 directly transit to a lower level and emit a light.

The select target 40 starts operating in response to a light emission from the quantum dot 33. If the quantum dot 33a emits a light, the select target 40a starts operating in response to the light emission, and if the quantum dot 33b emits a light, the select target 40b starts operating in response to the light emission.

If the select target 40a operates, a result is output, and a control light is supplied from the light supply unit 42a or is not supplied therefrom depending on the result. Similarly, if the select target 40b operates, a result is output, and a control light is supplied from the light supply unit 42b or is not supplied therefrom depending on the result.

For example, when the select target 40 is a slot machine for outputting a result of "success compensation attainment" at a predetermined probability or random probability, a control light may be supplied from the light supply unit 42 when the result of "success compensation attainment" is output from the operating select target, and a control light may not be supplied from the light supply unit 42 when the result of "failed compensation attainment" is output.

When a control light is supplied to the quantum dot 33, the exciters are excited in the quantum dot 33. For the quantum dot 33 in which the exciters are excited, the exciters injected from the quantum dot 32 are prevented from transiting to the lower level and the exciters are prevented from moving to the quantum dot 33. Thus, the exciters at the resonant level in the quantum dot 32 directly transit to its lower level and emit a light without moving to the quantum dot 33.

A light emitted from the quantum dot 32 is detected by the light detection unit 13 and is sent to the PC 11 as described above.

When a control light is supplied to the quantum dot 33, various parameters such as light intensity of the control light to be supplied, the amount of light, and the number of times may be weighted and added. That is, the exciters may not be excited to the lower level until a control light is supplied to the quantum dot 33 several times. Thereby, the result of the select target is output several times and finally the exciters are excited to the lower level of the quantum dot 33 and can be reflected on the light emission state of the quantum dot 32.

In this way, according to the present invention, even when which to select the select target 40a or 40b is searched, a control light can be supplied to the quantum dot 33 depending on the result when the select target 40 is selected, and correspondingly the light emission state of the output light from the quantum dot 32 can be changed. Then, the output light from the quantum dot 32 is read thereby to display a solution indicating a select priority as to which of the select targets 40 to select in order to maximize the amount of accumulated attained compensation. Any conventional operation formulas may be employed for finding the solution.

Also in the quantum dot device 5, feedback control may be performed by a control light via the light supply unit 12 by making use of a means such as so-called light switch or waveguide uniquely operating via a light output from the quantum dot 32 without using the PC 11. Thus, the present invention does not absolutely need the PC 11, and may be replaced with any feedback control means with no CPU.

The quantum dot device 5 is not limited to the above embodiment. For example, for an arrangement of the quantum dots, the quantum dots 31, 33 and 32 may be arranged in this order without arranging the quantum dots 31, 32, 33 in ascending order of volume. Also in this case, the operations of the quantum dots 31 to 33 are the same as the above.

Also in this case, the exciters move from the quantum dot 31 to the quantum dots 33. Then, the select target operates in response to an output light from the quantum dot 33, and a control light is supplied to the quantum dot 33 based on the result. When "success compensation attainment" is output, the exciters are filled at the lower level of the quantum dot 33, and when a light emission is difficult due to the discharging of the exciters from the quantum dot 33, the exciters from the quantum dot 31 move to the quantum dots 32 via the quantum dots 33, and emit a light as an output light. That is, the state of the exciters in the quantum dot 33 is controlled, thereby controlling the state of the exciters at the resonant level in the resonating quantum dot 32 and reflecting it on the light emission state of the output light from the quantum dot 32. For example, when the select targets 40 are slot machines, if a person does not know the compensation attainment success probability of which slot machine is higher, the output light from the quantum dot 32 is read via the solution searching system 1' thereby to predict the probability more rapidly and accurately.

The present invention is not limited to the solution searching system 1, and may be realized as the quantum dot device 3, 3' or 5.

What is claimed is:

1. A solution searching system by quantum dots comprising:
    an energy supply quantum dot having an energy level where exciter photons are generated in response to a supplied input light;
    a plurality of output display quantum dots each of which has a larger volume than the energy supply quantum dot and has a resonant level such that the output display quantum dots can emit an output light in response to an injection of the exciter photons, wherein the exciter photons are injected from an input quantum dot and with an energy level corresponding thereto;
    a light detection unit for detecting a light emission state of the output light for each of the plurality of output display quantum dots;
    a control light supply unit capable of supplying a control light to the output display quantum dots to control an intensity of the output light generated by the output display quantum dots in response to the injection of the exciter photons, the control light comprising controlling exciter photons; and
    a feedback control unit for controlling the control light to be supplied by the control light supply unit for each of the output display quantum dots based on the light emission state of the output light for each of the output display quantum dots detected by the light detection unit and previously-input search problem information,
    wherein the feedback control unit repeatedly performs supply control of the control light thereby to finally display a search solution for the previously-input search problem information based on the light emission state of the output light from each of the output display quantum dots detected by the light detection unit,
    wherein a propositional logical formula made of N variables as the previously-input search problem information is given and "true" or "false" of the variables is assigned to each of the output display quantum dots, a number of the output display quantum dots being 2N,
    wherein the feedback control unit determines whether the light emission state corresponds to "true" or "false" based on whether a light emission intensity of the output light emitted from each of the output display quantum dots exceeds a threshold, and
    wherein when there is provided, as the previously-input search problem information, a propositional logical formula in a conjunctive normal form in which AND of a plurality of terms is "true" and OR of two or three variables (literal) is given to each of the terms, and the output display quantum dots displaying "true" and "false" of one variable configuring the terms are in the light emission state, the feedback control unit controls the control light to be supplied by the control light supply unit in order to prevent a light emission of a quantum dot for which OR with a variable in the light emission state does not form "true" among the quantum dots displaying "true" and "false" of other variables configuring the terms.

2. The solution searching system by quantum dots according to claim 1, wherein the feedback control unit is given, as the previously-input search problem information, a propositional logical formula made of N variables, the variables are assigned to the output display quantum dots, respectively, a number of the output display quantum dots being N, and wherein the output light emitted from each of the output display quantum dots is binarized to assign "true" and "false" to the variables.

3. The solution searching system by quantum dots according to claim 2, wherein the feedback control unit controls the control light to be supplied by the control light supply unit for each of the output display quantum dots in order to turn on a quantum dot not meeting the propositional logical formula depending on "true" or "false" based on the light emission state of each detected binarized output light.

4. The solution searching system by quantum dots according to claim 3, wherein the feedback control unit is given, as the previously-input search problem information, a satisfiability problem for searching satisfiable variables for making the total values of the propositional logical formula "true".

5. The solution searching system by quantum dots according to claim 3, wherein when controlling the control light supply unit in order to supply the control light to each of the output display quantum dots, the feedback control unit causes the control light supply unit to supply the controlling exciter photons, thereby restricting a generation of the output light and lowering an intensity of the output light, and thereby making the binarized light emission state "false", and when controlling the control light supply unit in order not to supply a control light to each of the output display quantum dots, the feedback control unit causes the control light supply unit to reduce a supply of the controlling exciter photon, thereby promoting the generation of the output light and increasing the intensity of the output light, and thereby making the binarized light emission state "true".

6. The solution searching system by quantum dots according to claim 4, wherein when controlling the control light supply unit in order to supply the control light to each of the output display quantum dots, the feedback control unit causes the control light supply unit to supply the controlling exciter photons, thereby restricting a generation of the output light and lowering an intensity of the output light, and thereby making the binarized light emission state "false", and when controlling the control light supply unit in order not to supply a control light to each of the output display quantum dots, the feedback control unit causes the control light supply unit to reduce a supply of the controlling exciter photon, thereby promoting the generation of the output light and increasing the intensity of the output light and thereby making the binarized light emission state "true".

7. The solution searching system by quantum dots according to claim 2, wherein when controlling the control light supply unit in order to supply the control light to each of the output display quantum dots, the feedback control unit causes the control light supply unit to supply the controlling exciter photons to the output display quantum dots, thereby restricting the output quantum dots from generating the output light in response to the exciter photons and lowering the intensity of the output light, and thereby making the binarized light emission state "false", and wherein when controlling the control light supply unit in order not to supply the control light to each of the output display quantum dots, the feedback control unit causes the control light supply unit to reduce a supply of the controlling exciter photon to the output display quantum dots, thereby promoting the generation of the output light by the output quantum dots in response to the exciter photons and increasing the intensity of the output light, and thereby making the binarized light emission state "true".

8. The solution searching system by quantum dots according to claim 1, wherein when controlling the control light supply unit in order to supply the control light to each of the output display quantum dots, the feedback control unit causes the control light supply unit to supply the controlling exciter photons to the output display quantum dots, thereby restricting the output quantum dots from generating the output light in response to the exciter photons and lowering the intensity of the output light to a threshold or less, thereby not corresponding to "true" or "false", and wherein when controlling the control light supply unit in order not to supply the control light to each of the output display quantum dots, the feedback control unit causes the control light supply unit to reduce a supply of the controlling exciter photon to the output display quantum dots, thereby promoting the generation of the output light by the output quantum dots in response to the exciter photons and increasing the intensity of the output light to the threshold or more, thereby corresponding to "true" or "false".

9. The solution searching system by quantum dots according to claim 8, wherein for a pair of the output display quantum dots of interest for displaying "true" or "false" of one variable, the feedback control unit controls the control light to be supplied by the control light supply unit such that when an output light is emitted from any one of the pair of output display quantum dots, an output light is prevented from emitting from the other one of the pair of output display quantum dots.

10. The solution searching system by quantum dots according to claim 8, wherein when there is provided, as the previously-input search problem information, a propositional logical formula in the conjunctive normal form in which AND of a plurality of terms is "true" and OR of two or three variables (literal) is given to each of the terms, and the output display quantum dots displaying "true" and "false" of one variable configuring the terms are in the light emission state, the feedback control unit controls the control light to be supplied by the control light supply unit in order to prevent a light emission of a quantum dot for which OR with a variable in the light emission state does not form "true" among the quantum dots displaying "true" and "false" of other variables configuring the terms.

11. The solution searching system by quantum dots according to claim 8, wherein when there is given, as the previously-input search problem information, a propositional logical formula in the conjunctive normal form in which AND of a plurality of terms is "true" and OR of two or three variables is given to each of the term, for a pair of the output display quantum dots of interest for displaying "true" and "false" of one variable in the process of controlling the control light to be supplied based on the search problem information, the feedback control unit controls the control light to be supplied so as not to select the light emission state as a search solution when both the quantum dots emit a light at the same time.

12. The solution searching system by quantum dots according to claim 1, wherein for a pair of the output display quantum dots of interest for displaying "true" or "false" of one variable, the feedback control unit controls the control light to be supplied by the control light supply unit such that when the output light is emitted from any one of the pair of output display quantum dots, the output light is prevented from emitting from the other one of the pair of output display quantum dots.

13. The solution searching system by quantum dots according to claim 12, wherein when there is provided, as the previously-input search problem information, a propositional logical formula in the conjunctive normal form in which AND of a plurality of terms is "true" and OR of two or three variables (literal) is given to each of the terms, and the output display quantum dots displaying "true" and "false" of one variable configuring the terms are in the light emission state, the feedback control unit controls the control light to be supplied by the control light supply unit in order to prevent a light emission of a quantum dot for which OR with a variable in the light emission state does not form "true" among the quantum dots displaying "true" and "false" of other variables configuring the terms.

14. The solution searching system by quantum dots according to claim 12, wherein when there is given, as the previously-input search problem information, a propositional logical formula in the conjunctive normal form in which AND of a plurality of terms is "true" and OR of two or three variables is given to each of the term, for a pair of the output display quantum dots of interest for displaying "true" and "false" of one variable in the process of controlling the control light to be supplied based on the search problem information, the feedback control unit controls the control light to be supplied so as not to select the light emission state as a search solution when both the quantum dots emit a light at the same time.

15. The solution searching system by quantum dots according to claim 1, wherein when there is given, as the previously-input search problem information, a propositional logical formula in the conjunctive normal form in which AND of a plurality of terms is "true" and OR of two or three variables is given to each of the terms, for a pair of the output display quantum dots of interest for displaying "true" and "false" of one variable in the process of controlling the control light to be supplied based on the search problem information, the feedback control unit controls the control light to be supplied so as not to select the light emission state as a search solution when both the quantum dots emit a light at the same time.

16. A quantum dot device which is applied to the solution searching system by quantum dot according to claim 1 and comprises the energy supply quantum dot and the output display quantum dots.

17. The solution searching system by quantum dots according to claim 1, wherein when there is given, as the previously-input search problem information, a propositional logical formula in the conjunctive normal form in which AND of a plurality of terms is "true" and OR of two or three variables is given to each of the term, for a pair of the output display quantum dots of interest for displaying "true" and "false" of one variable in the process of controlling the control light to be supplied based on the search problem information, the feedback control unit controls the control light to be supplied so as not to select the light emission state as a search solution when both the quantum dots emit a light at the same time.

18. A solution searching system by quantum dots, comprising:

an energy supply quantum dot having an energy level where exciter photons are generated in response to a supplied input light;
a plurality of output display quantum dots each of which has a larger volume than the energy supply quantum dot and has a resonant level such that the exciter photons can be injected, and the output display quantum dots can emit an output light in response to an injection of the exciter photons;
a plurality of outside contact quantum dots provided for the output display quantum dots, each of which has a larger volume than the output display quantum dot, can be resonant with the resonant level in the output display quantum dot, has an injected resonant level where exciter photons are injected, and can emit the output light for outside contact in response to the injection of the exciter photons;
a light detection unit for detecting a light emission state of the output light per each of the output display quantum dots;
a plurality of select targets provided for the outside contact quantum dots, each of which operates under a preset condition to output a result in response to an outside contact output light emitted from the outside contact quantum dot; and
a control light supply unit which supplies a control light to the outside contact quantum dot based on the result output from the select target, accordingly controls a state of the exciter photons at the injected resonant level thereby to control a state of the exciter photons at the resonant level in the resonating output display quantum dot, and can present a corresponding state in the light emission state of the output light from the output display quantum dot, wherein the control light comprises controlling exciter photons,
wherein a solution indicating a select priority of the select targets is displayed based on the light emission state of the output light from each of the output display quantum dot finally read by the light detection unit after repeated supply control of the control light,
wherein a propositional logical formula made of N variables as the previously-input search problem information is given and "true" or "false" of the variables is assigned to each of the output display quantum dots, a number of the output display quantum dots being 2N,
wherein the feedback control unit determines whether the light emission state corresponds to "true" or "false" based on whether a light emission intensity of the output light emitted from each of the output display quantum dots exceeds a threshold, and
wherein when there is provided, as the previously-input search problem information, a propositional logical formula in a conjunctive normal form in which AND of a plurality of terms is "true" and OR of two or three variables (literal) is given to each of the terms, and the output display quantum dots displaying "true" and "false" of one variable configuring the terms are in the light emission state, the feedback control unit controls the control light to be supplied by the control light supply unit in order to prevent a light emission of a quantum dot for which OR with a variable in the light emission state does not form "true" among the quantum dots displaying "true" and "false" of other variables configuring the terms.

* * * * *